(12) United States Patent
Kim

(10) Patent No.: US 11,579,188 B2
(45) Date of Patent: Feb. 14, 2023

(54) MONITORING CIRCUIT AND SEMICONDUCTOR DEVICE

(71) Applicant: SK hynix Inc., Gyeonggi-do (KR)

(72) Inventor: Tae-Pyeong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/673,029

(22) Filed: Feb. 16, 2022

(65) Prior Publication Data

US 2022/0170981 A1    Jun. 2, 2022

Related U.S. Application Data

(63) Continuation of application No. 16/736,249, filed on Jan. 7, 2020, now Pat. No. 11,287,469.

(30) Foreign Application Priority Data

Jul. 11, 2019   (KR) .................... 10-2019-0083760

(51) Int. Cl.
    *G01R 31/28*   (2006.01)
    *H01L 21/66*   (2006.01)
    *H03K 19/20*   (2006.01)

(52) U.S. Cl.
    CPC .......... *G01R 31/2884* (2013.01); *H01L 22/34* (2013.01); *H03K 19/20* (2013.01)

(58) Field of Classification Search
    CPC . G01R 31/2884; G01R 31/2607; H01L 22/34; H03K 19/20; G11C 29/006; G11C 29/50
    USPC .................. 324/750.3, 750.01, 537, 500
    See application file for complete search history.

(56) References Cited

U.S. PATENT DOCUMENTS

2021/0199710 A1* 7/2021 He .................. G01R 31/2886
2021/0341535 A1* 11/2021 Hsieh ................. G01R 31/3004
2022/0084896 A1* 3/2022 Marr ........................ G01B 7/18

FOREIGN PATENT DOCUMENTS

KR   10-2007-0073274 A   7/2007
KR   10-2008-0036715 A   4/2008

* cited by examiner

*Primary Examiner* — Giovanni Astacio-Oquendo
(74) *Attorney, Agent, or Firm* — IP & T Group LLP

(57) ABSTRACT

Embodiments of the present disclosure relate to a monitoring circuit and a semiconductor device, and particularly, to a monitoring circuit including an oscillation circuit configured to generate an oscillation signal having a rising characteristic or a falling characteristic according to a threshold voltage level and a counter configured to count the number of rises or the number of falls of the oscillation signal, and a semiconductor device including the monitoring circuit.

12 Claims, 19 Drawing Sheets

MONITORING CIRCUIT AND SEMICONDUCTOR DEVICE

CROSS REFERENCE TO RELATED APPLICATION

This application is a continuation of U.S. patent application Ser. No. 16/736,249 filed on Jan. 7, 2020, which claims priority under 35 U.S.C. 119(a) to Korean patent application number 10-2019-0083760 filed in the Korean intellectual property office on Jul. 11, 2019, which is incorporated herein by reference in its entirety.

BACKGROUND OF THE INVENTION

1. Field of the Invention

Embodiments of the present disclosure relate to a monitoring circuit and a semiconductor device.

2. Description of the Prior Art

A semiconductor device manufactured through semiconductor processing may not operate normally, or may have defects due to various factors. Thus, defects of the semiconductor device are checked in the semiconductor processing, but the accuracy of checking is not high, and it takes a long time to check the semiconductor device. In addition, heretofore according to existing checking methods, it is generally not practical to check defects of many semiconductor devices fabricated on a substrate one by one.

SUMMARY OF THE INVENTION

The present invention is directed generally to a monitoring circuit for a semiconductor device and a semiconductor device including the same.

The monitoring circuit may accurately and quickly recognize defects of the semiconductor device.

The monitoring circuit may accurately and quickly recognize whether or not each individual semiconductor device is manufactured normally without defects through the semiconductor processing.

The monitoring circuit may accurately monitor a semiconductor device in which transistors having various threshold voltage levels are arranged.

The monitoring circuit may monitor a semiconductor device in a digital manner.

The semiconductor device may self-monitor its own state, performance, and characteristics.

The semiconductor device may self-monitor monitor its own performance, characteristics, or state by itself when transistors arranged therein have various threshold voltage levels.

The semiconductor device may self-monitor its own manufacturing process.

According to an aspect of the present invention, a monitoring circuit for monitoring a semiconductor device is provided. The monitoring circuit may monitor the state, characteristics, or performance of the semiconductor device.

The monitoring circuit may be included in the semiconductor device.

The monitoring circuit may include an oscillation circuit configured to generate an oscillation signal having a rising characteristic and/or a falling characteristic according to a threshold voltage level and a counter configured to count a number of rises or a number of falls of the oscillation signal.

The rising characteristic and/or the falling characteristic of the oscillation signal may mean a speed, a slope, or the like at which a voltage rises or falls in the oscillation signal, and may mean an interval between a rising section and a falling section, the number of rising sections or falling sections, an interval between rising sections (which may indicate a period), an interval between falling sections (which may indicate a period), and the like.

The oscillation circuit may include one or more oscillators configured to generate an oscillation signal according to an oscillation-enable signal.

Each oscillator may be a digital-based ring oscillator.

Each oscillator may include a NAND gate and odd-numbered inverters connected in series with the NAND gate.

If the oscillation circuit includes two or more oscillators, the two or more oscillators may respectively generate oscillation signals at different timings according to oscillation-enable signals input at different timings.

If the oscillation circuit includes two or more oscillators, the monitoring circuit may further include a multiplexer configured to transmit an oscillation signal generated by one of the two or more oscillators to the counter according to a selection signal.

The two or more oscillators may respectively generate oscillation signals with different rising characteristics and/or different falling characteristics according to different threshold voltage levels.

The oscillation circuit may include a first oscillator configured to generate a first oscillation signal according to a first threshold voltage level and a second oscillator configured to generate a second oscillation signal according to a second threshold voltage level different from the first threshold voltage level.

The second threshold voltage level may be greater than the first threshold voltage level.

The first oscillation signal may have a larger number of rises or fallings than the second oscillation signal.

The oscillation circuit may further include a third oscillator configured to generate a third oscillation signal according to a third threshold voltage level.

The third threshold voltage level may be greater than the second threshold voltage level.

The second oscillation signal may have a larger number of rises or fallings than the third oscillation signal.

According to another an embodiment of the present disclosure may include a monitoring circuit including: an oscillation circuit including a first oscillator configured to generate a first oscillation signal according to input of a first oscillation-enable signal and a second oscillator configured to generate a second oscillation signal according to input of a second oscillation-enable signal; and a counter configured to count a number of rises or a number of falls of each of the first oscillation signal and the second oscillation signal.

The first oscillator may generate a first oscillation signal according to a first threshold voltage level.

The second oscillator may generate the second oscillation signal different from the first oscillation signal according to a second threshold voltage level different from the first threshold voltage level.

According to another aspect, an embodiment of the present disclosure may provide a semiconductor device including: a substrate; and at least one monitoring circuit arranged on the substrate and configured to generate an oscillation signal having a rising characteristic or a falling characteristic according to a threshold voltage level when an oscillation-enable signal is input and to count the number of rises or a number of falls of the oscillation signal.

The rising characteristic and/or the falling characteristic of the oscillation signal may mean a speed, a slope, or the like at which a voltage rises or falls in the oscillation signal, and may mean an interval between a rising section and a falling section, the number of rising sections or falling sections, an interval between rising sections (which may indicate a period), an interval between falling sections (which may indicate a period), and the like.

A plurality of monitoring circuits may be arranged on the substrate, and the plurality of monitoring circuits may be distributed and arranged in an area different from the area in which a memory cell array is arranged in the semiconductor device.

The monitoring circuit may include an oscillation circuit configured to generate an oscillation signal according to input of an oscillation-enable signal and a counter configured to count the number of rises or the number of falls of the oscillation signal.

Transistors having a first threshold voltage level and transistors having a second threshold voltage level may be arranged in an area in which a memory cell array is arranged in the semiconductor device.

According to another an embodiment of the present disclosure may include a monitoring circuit including: a first oscillation circuit suitable for generating a first oscillation signal corresponding to a first threshold voltage, a second oscillation circuit suitable for generating a second oscillation signal corresponding to a second threshold voltage less than the first threshold voltage, a third oscillation circuit suitable for generating a third oscillation signal corresponding to a third threshold voltage less than the second threshold voltage, a multiplexer suitable for selecting one of the first, second, and third oscillation signals in response to a selection signal and a counter suitable for counting a number of rises or a number of falls of the selected oscillation signal to generate a count value.

According to an embodiment of the present disclosure, it is possible to accurately and quickly recognize defects of a semiconductor device.

In addition, according to an embodiment of the present disclosure, it is possible to provide a semiconductor device capable of monitoring its own state, performance, characteristics, or the like by itself.

In addition, according to an embodiment of the present disclosure, it is possible to provide a semiconductor device capable of monitoring its own manufacturing process by itself.

In addition, according to an embodiment of the present disclosure, it is possible to accurately and quickly recognize whether or not each individual semiconductor device is manufactured normally through semiconductor processing.

In addition, according to an embodiment of the present disclosure, it is possible to accurately monitor a semiconductor device in which transistors having various threshold voltage levels are arranged.

In addition, according to an embodiment of the present disclosure, it is possible to provide a semiconductor device capable of monitoring its own performance, characteristics, or state by itself when transistors arranged therein have various threshold voltage levels.

In addition, according to an embodiment of the present disclosure, it is possible to provide a monitoring circuit capable of monitoring a semiconductor device in a digital manner.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Hereinafter, embodiments of the disclosure will be described in detail with reference to the accompanying drawings.

Figure 1:
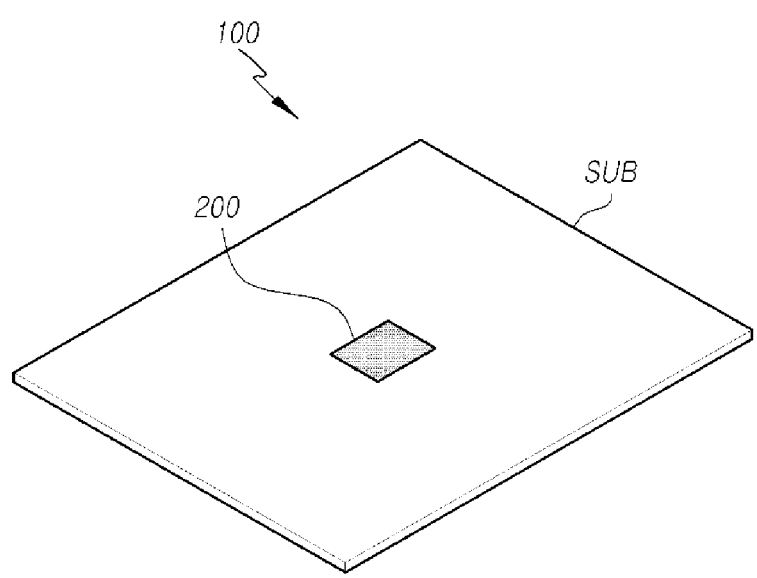
FIG. 1 is a diagram schematically illustrating a semiconductor device comprising a monitoring circuit according to an embodiment of the present disclosure.
Figure 2:
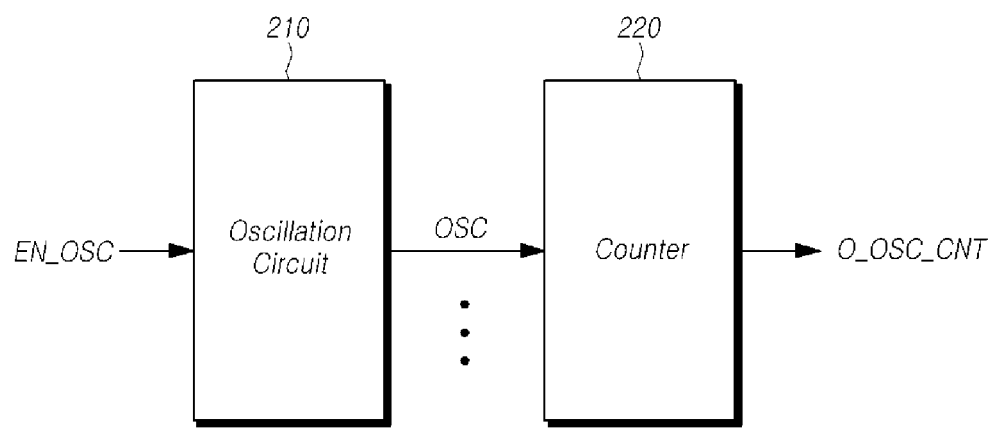
FIG. 2 is a diagram schematically illustrating a monitoring circuit according to an embodiment of the present disclosure.

FIG. 1 is a diagram schematically illustrating a semiconductor device 100 including a monitoring device 200 according to an embodiment of the present disclosure. FIG. 2 illustrates a configuration of the monitoring circuit 200, according to an embodiment.

Referring now to FIGS. 1 and 2, the semiconductor device 100 may include at least one substrate (SUB), and the monitoring circuit 200 may be arranged on or in the at least one substrate (SUB). In an embodiment, the monitoring circuit 200 may be formed in the substrate (SUB) with the top surface of the monitoring circuit 200 being substantially coplanar with the top surface of the substrate (SUB). It is noted, however, that the invention is not limited based on the particular way by which the monitoring circuit 200 may be disposed on or in the substrate (SUB). The monitoring circuit 200 may be enabled according to an input of an oscillation-enable signal (EN_OSC). In response to the oscillation-enable signal (EN_OSC), the monitoring circuit 200 may generate an oscillation signal (OSC) and count the number of rises or the number of falls of the oscillation signal (OSC).

For example, the semiconductor device 100 may be a memory semiconductor (or non-system semiconductor) for storing information (also referred to as a memory, a memory device, or a storage device) or a memory controller for controlling the operation of the memory semiconductor. In some cases, the semiconductor device 100 may be a non-memory semiconductor (or system semiconductor) for information processing such as operation, and inference.

For example, the memory semiconductor may include one of a random access memory (RAM), a dynamic RAM (DRAM), a static RAM (SRAM), a magnetic RAM (MRAM), a resistance RAM (RRAM), a video RAM (VRAM), a read only memory (ROM), and a NAND flash memory. However, the memory semiconductor is not limited thereto, and may be any of various other types of semiconductors as long as it can store information.

For example, the non-memory semiconductor may include a central processing unit (CPU), an application processor (AP) that may serve as a CPU in a mobile terminal such as a smartphone and a tablet PC, a multimedia semiconductor, an application-specific integrated circuit (ASIC), a merged DRAM logic (MDL) semiconductor, a power semiconductor, a microprocessor, an image sensor, and an artificial-intelligence semiconductor, depending on the application range. However, the non-memory semiconductor is not limited thereto, and may be any of various types of semiconductors as long as it has a function other than a function of storing information.

The monitoring circuit 200 may monitor a state and/or characteristics of the semiconductor device 100. For example, the monitoring circuit 200 may recognize a state and/or characteristics of the semiconductor device 100 manufactured through semiconductor processing. The monitoring circuit 200 may determine whether or not the semiconductor device 100 is manufactured normally according to the recognized result. The semiconductor device 100 being manufactured normally may mean that the semiconductor device 100 which is manufactured through semiconductor processing has a desired state or one or more desired characteristics. For example, the monitoring circuit 200 may recognize a desired state or one or more characteristics of the semiconductor device 100 during an operation and/or during a non-operation period thereof. The monitoring circuit 200 may determine whether or not the semiconductor device 100 has a normal state or characteristic, or whether or not the semiconductor device 100 operates normally according to a recognized result. The semiconductor device 100 having a normal state or characteristic may mean that the state or characteristic information (e.g. semiconductor process state information, temperature, operating speed) of the semiconductor device is within a set reference range.

The number of monitoring circuits 200 in the semiconductor device 100 may differ by design. For example, in an embodiment the semiconductor device 100 may have only one monitoring circuit 200. In other embodiments, the semiconductor device 100 may have two or more monitoring circuits 200.

The oscillation signal (OSC) generated by the monitoring circuit 200 may have a variable voltage. For example, the oscillation signal (OSC) may have any one of various types of signal waveforms, including a sine wave, a square wave, and a triangular wave.

The oscillation signal (OSC) may have at least one rising section in which the voltage rises and at least one falling section in which the voltage falls.

The number of rising sections in the oscillation signal (OSC) may correspond to the number of rises of the oscillation signal (OSC). The number of falling sections in the oscillation signal (OSC) may correspond to the number of falls of the oscillation signal (OSC).

The monitoring circuit 200 may generate an oscillation signal (OSC) having a rising characteristic and/or a falling characteristic according to a unique threshold voltage level.

A rising and/or a falling characteristic of the oscillation signal may include a speed, a slope, or the like at which the voltage rises or falls in the oscillation signal. A rising characteristic and/or a falling characteristic of the oscillation signal may include an interval between the rising section and the falling section, the number of rising sections or falling sections, an interval (or a period) between the rising sections (which may indicate a period), and an interval (or a period) between the falling sections.

As described above, as the rising characteristic and/or the falling characteristic of the oscillation signal (OSC) may vary according to a unique threshold voltage level, the number of the rising sections and the number of falling sections of the oscillation signal (OSC) may also vary within a predetermined time according to the unique threshold voltage level.

The monitoring circuit 200 may include an oscillation circuit 210 and at least one counter 220. The oscillation circuit 210 may generate an oscillation signal (OSC) in response to an input of an oscillation-enable signal (EN_OSC). The counter 220 may count the number of rises or the number of falls of the oscillation signal (OSC) and output a count value (O_OSC_CNT).

Figure 3:
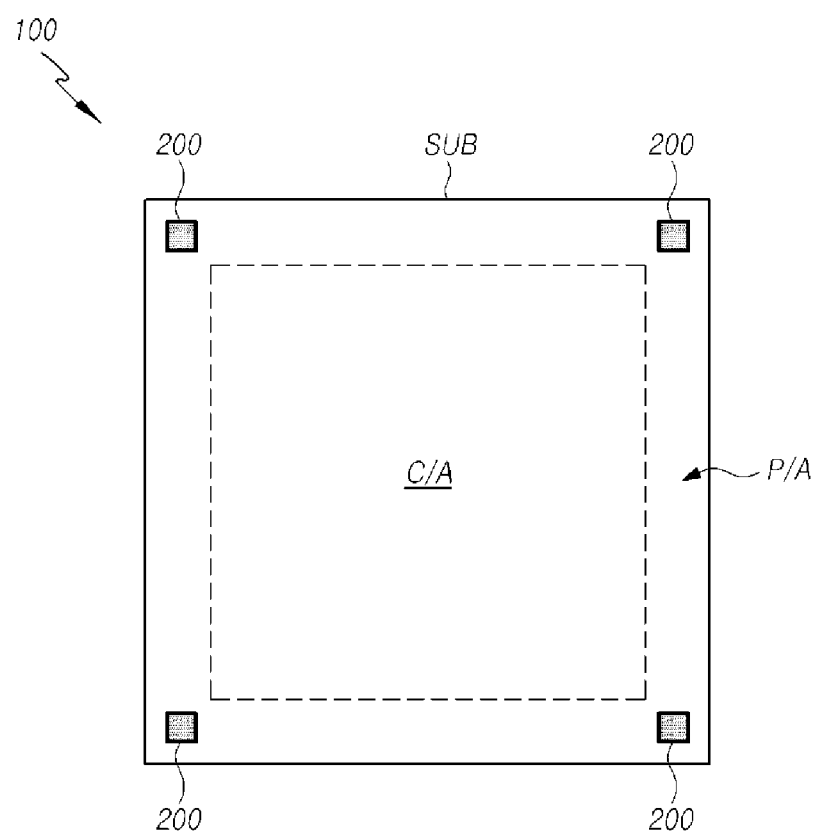
FIG. 3 is a diagram illustrating an arrangement of monitoring circuits in a planar structure semiconductor device according to an embodiment of the present disclosure.
Figure 4:
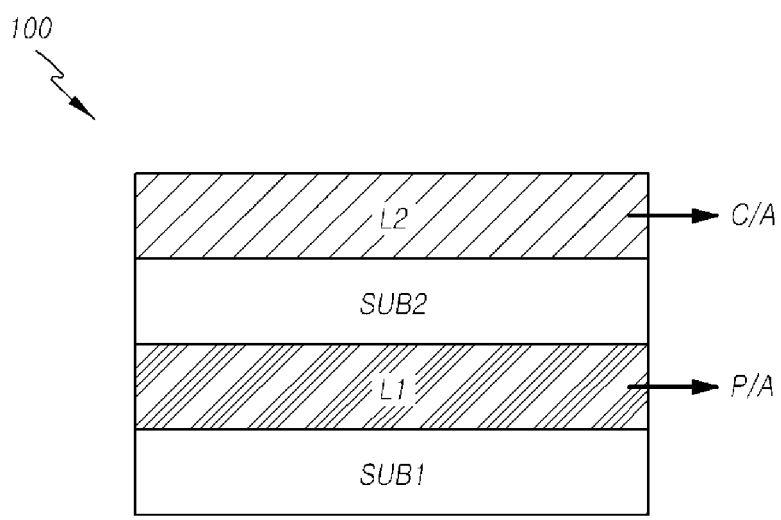
FIGS. 4 and 5 are diagrams illustrating vertical structures of a semiconductor device according to embodiments of the present disclosure.
Figure 5:
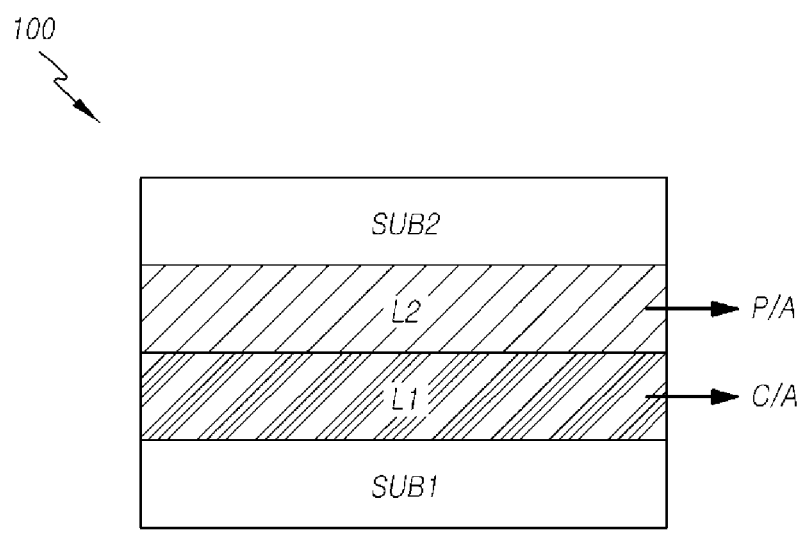
Figure 6:
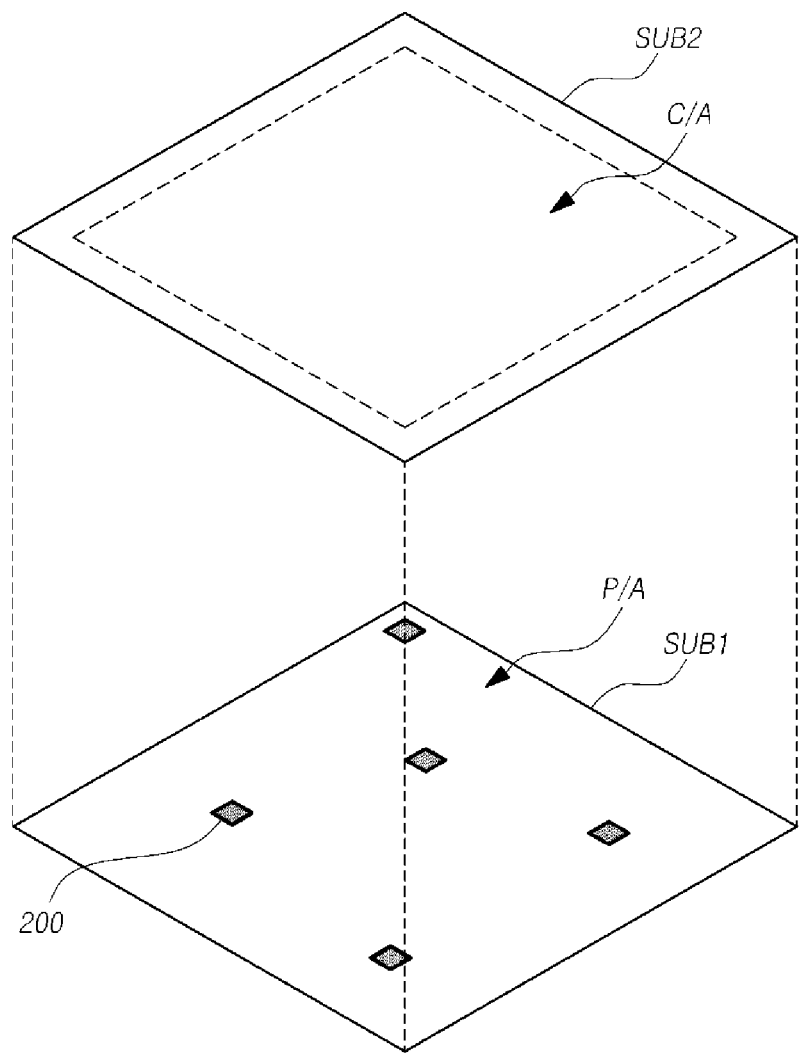
FIGS. 6 and 7 are diagrams illustrating an arrangement of monitoring circuits in a vertical structure semiconductor device according to an embodiment of the present disclosure.
Figure 7:
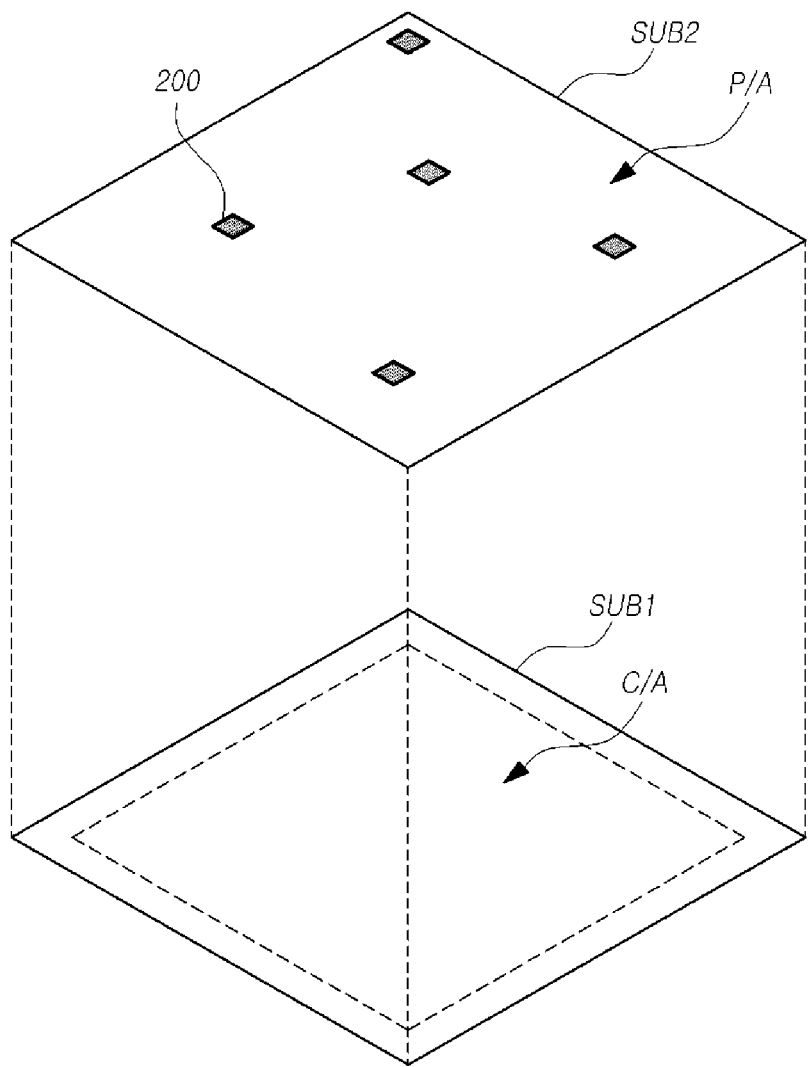

FIGS. 3 to 7 are diagrams illustrating examples of the positioning of the monitoring circuit 200 in the semiconductor device 100 according to various embodiments of the present disclosure. FIG. 3 is a diagram illustrating an arrangement of a plurality of monitoring circuits 200 in a planar structure semiconductor device 100. FIGS. 4 and 5 are diagrams illustrating vertical structures of the semiconductor device 100 according to an embodiment of the present disclosure. FIGS. 6 and 7 are diagrams illustrating arrangements of monitoring circuits 200 in vertical structure semiconductor device 100 according to embodiments of the present disclosure.

The semiconductor device 100 may be implemented for various purposes and in any of various types, as described above. The semiconductor device 100 may include a predefined core area (C/A) and a non-core area (P/A) other than the core area, regardless of the purposes and type thereof.

The core area (C/A) may be an area in which core circuits (including lines, electrodes, and elements such as transistors) conforming to the primary purpose of the semiconductor device 100 are arranged. The non-core area (P/A) may be an area in which non-core circuits are arranged for assisting or supporting the operation of the core circuit in the core area (C/A). The non-core area (P/A) may also be called a "secondary area" or a "peripheral area", and the non-core circuit may be called a "secondary circuit" or a "peripheral circuit".

For example, the monitoring circuit 200 may be arranged in the core area (C/A).

For another example, the monitoring circuit 200 may be arranged in the non-core area (P/A) different from the core area (C/A). That is, the oscillation circuit 210 and the counter 220 may be arranged in the non-core area (P/A) in the semiconductor device 100, which is different from the core area (C/A) predefined in the semiconductor device 100.

For another example, the oscillation circuit 210 may be arranged inside the semiconductor device 100, and the counter 220 may be arranged outside the semiconductor device 100. The counter 220 may be connected to the semiconductor device 100 through a pin of the semiconductor device 100. The counter 220 may be connected to the oscillation circuit 210 either directly or indirectly. For example, the counter 220 may be connected to the oscillation circuit 210 either directly or indirectly through a pin of the semiconductor device 100.

In this case, the oscillation circuit 210 included in the monitoring circuit 200 according to embodiments of the present disclosure may be arranged in a non-core area (P/A) which is different from the predefined core area (C/A) of the semiconductor device 100.

For another example, the oscillation circuit 210 included in the monitoring circuit 200 according to embodiments of the present disclosure may be arranged in the core area (C/A) of the semiconductor device 100, and the counter 200 may be arranged in the non-core area (P/A) of the semiconductor device 100.

For another example, the oscillation circuit 210 may be arranged in the non-core area (P/A) of the semiconductor device 100, and the counter 220 may be arranged in the core area (C/A) of the semiconductor device 100.

If the semiconductor device 100 is a memory semiconductor, a memory cell array may be arranged in the core area (C/A) of the semiconductor device 100, and a memory operation circuit for operating the memory cell array may be arranged in the non-core area (P/A) of the semiconductor device 100. In this case, the monitoring circuit 200 may be arranged in an area (i.e., non-core area (P/A)) that is different from the area (i.e., core area (C/A)) in which the memory cell array is arranged in the semiconductor device 100.

If the semiconductor device 100 is a non-memory semiconductor or a memory controller, core circuits that meet their original purposes, other than the monitoring circuit 200, may be arranged in the core area (C/A) in the semiconductor device 100, and circuits for interfaces between the monitoring circuit 200 and peripheral devices may be arranged in the non-core area (P/A) in the semiconductor device 100. In this case, the monitoring circuit 200 may be arranged in an area (i.e., non-core area (P/A)) that is different from the area (i.e., core area (C/A)) in which the core circuits are arranged in the semiconductor device 100.

In the following description, it is assumed, as an example, that the monitoring circuit 200 is arranged inside the semiconductor device 100 and is arranged in the non-core area (P/A) in the semiconductor device 100.

Transistors having different threshold voltage levels may be arranged in the core area (C/A) in the semiconductor device 100 according to an embodiment of the present disclosure.

For example, transistors having a first threshold voltage level and transistors having a second threshold voltage level may be arranged in the core area (C/A). The second threshold voltage level may be different from the first threshold voltage level. A memory cell array or a core circuit may be arranged in the core area (C/A) of the semiconductor device 100. The first threshold voltage level and the second threshold voltage level may be voltage levels that do not have voltage sections overlapping each other. Alternatively, the first threshold voltage level and the second threshold voltage level may be voltage levels having some voltage sections overlapping each other.

For another example, transistors having a first threshold voltage level, transistors having a second threshold voltage level, and transistors having a third threshold voltage level may be arranged in the core area (C/A) in which a memory cell array or a core circuit may be arranged in the semiconductor device 100. The first to third threshold voltage levels may be different. The first to third threshold voltage levels may be voltage levels that do not have voltage sections overlapping each other. Alternatively, the first to third threshold voltage levels may be voltage levels having some voltage sections overlapping each other.

Referring to FIG. 3, when the semiconductor device 100 has a planar structure, the core area (C/A) and the non-core area (P/A) may exist in the same plane. The non-core area (P/A) is another area that does not overlap the core area (C/A), and may be an outer area of the core area (C/A). The non-core area (P/A) may be an outer edge area of the core area (C/A). The non-core area (P/A) may also be referred to as a "secondary area" or a "peripheral area".

A plurality of monitoring circuits 200 may be arranged in the non-core area (P/A) on the substrate (SUB), e.g. four monitoring circuits 200 may be arranged in the non-core area (P/A) on the substrate (SUB) as shown in FIG. 3. However, the invention is not limited in this way and, generally, at least one monitoring circuit 200 may be arranged in the non-core area (P/A) on the substrate (SUB).

Referring to FIG. 4, the semiconductor device 100 may have a first vertical structure in which a first circuit layer (L1) is positioned on a first substrate (SUB1), a second substrate (SUB2) is positioned on the first circuit layer (L1), and a second circuit layer (L2) is positioned on the second substrate (SUB2).

The first vertical structure may be obtained by stacking the first substrate (SUB1), the first circuit layer (L1), the second substrate (SUB2), and the second circuit layer (L2) in sequence in the semiconductor processing.

For an example of the first vertical structure, the first circuit layer (L1) on the first substrate (SUB1) may include one or more layers in which non-core circuits (e.g., a secondary circuit or a peripheral circuit) are arranged, and the second circuit layer (L2) on the second substrate (SUB2) may include one or more layers in which core circuits (e.g., a memory cell array or a primary circuit) are arranged. In this case, the area in which the first circuit layer (L1) is positioned on the first substrate (SUB1) may be a non-core area (P/A), and the area in which the second circuit layer (L2) is positioned on the second substrate (SUB2) may be a core area (C/A).

For another example of the first vertical structure, the first circuit layer (L1) on the first substrate (SUB1) may include one or more layers in which a core circuit (e.g., a primary circuit) is arranged, and the second circuit layer (L2) on the second substrate (SUB2) may include one or more layers in which a non-core circuit (e.g., a secondary circuit or a peripheral circuit) is arranged. In this case, the area in which the first circuit layer (L1) is positioned on the first substrate (SUB1) may be a core area (C/A), and the area in which the second circuit layer (L2) is positioned on the second substrate (SUB2) may be a non-core area (P/A).

Referring to FIG. 5, the semiconductor device 100 may have a second vertical structure in which a first circuit layer (L1) is positioned on a first substrate (SUB1), a second circuit layer (L2) is positioned on the first circuit layer (L1), and the second substrate (SUB2) is positioned on the second circuit layer (L2).

In the second vertical structure, the vertical position and manufacturing order of the first substrate (SUB1), the first circuit layer (L1), the second circuit layer (L2), and the second substrate (SUB2) may be varied.

The manufacturing process of the semiconductor device 100 having the second vertical structure may be as follows. In the semiconductor processing, first and second parts may be manufactured. The first part may include forming the first circuit layer (L1) stacked on the first substrate (SUB1). The second part may include forming the second circuit layer (L2) stacked on the second substrate (SUB2). Thereafter, the second part may be turned upside down, and the inverted second part may be bonded to the first part, e.g., through metal bonding, thereby manufacturing the semiconductor device 100 having the second vertical structure.

For an example of the second vertical structure, the first circuit layer (L1) may include one or more layers in which a core circuit (e.g., a memory cell array, a primary circuit, etc.) is arranged, and the second circuit layer (L2) may include one or more layers in which a non-core circuit (e.g., a secondary circuit or a peripheral circuit) is arranged. In this case, the area of the first circuit layer (L1) may be a core area (C/A), and the area of the second circuit layer (L2) may be a non-core area (P/A).

For another example of the second vertical structure, the first circuit layer (L1) may include one or more layers in which a non-core circuit (e.g., a secondary circuit or a peripheral circuit) is arranged, and the second circuit layer (L2) may include one or more layers in which a core circuit (e.g., a primary circuit) is arranged. In this case, the area of the first circuit layer (L1) may be a non-core area (P/A), and the area of the second circuit layer (L2) may be a core area (C/A).

FIGS. 6 and 7 are diagrams illustrating positions at which a monitoring circuit is arranged when a semiconductor device has a vertical structure according to an embodiment of the present disclosure.

Referring to FIG. 6, when the semiconductor device 100 has the first vertical structure, as described above with reference to FIG. 4, the area in which the first circuit layer (L1) is positioned on the first substrate (SUB1) may be a non-core area (P/A), and the area in which the second circuit layer (L2) is positioned on the second substrate (SUB2) may be a core area (C/A).

For example, a memory cell array (memory cells) or core circuits may be arranged in the core area (C/A). The non-core area (P/A) may also be referred to as a "secondary area" or a "peripheral area", which is different from the core area (C/A) but may overlap the core area (C/A).

In the case of the first vertical structure, one or more monitoring circuits 200 may be arranged in the non-core area (P/A) in which the first circuit layer (L1) is positioned on the first substrate (SUB1). If there are two or more monitoring circuits 200, the two or more monitoring circuits 200 may be distributed and arranged in the non-core area (P/A) in which the first circuit layer (L1) is positioned on the first substrate (SUB1). Since the two or more monitoring circuits 200 have a digital-based structure, it is possible to distribute and arrange the two or more monitoring circuits 200 in the non-core area (P/A).

According to the first vertical structure, one or more monitoring circuits 200 arranged in the non-core area (P/A) may not overlap the core circuits (e.g., a memory cell array, primary circuits, etc.) arranged in the core area (C/A) in the vertical direction. Alternatively, all or some of the one or more monitoring circuits 200 arranged in the non-core area (P/A) may overlap the core circuits (e.g., a memory cell array, primary circuits, etc.) arranged in the core area (C/A) in the vertical direction as described with FIG. 6.

Referring to FIG. 7, when the semiconductor device 100 has the second vertical structure, as described above with reference to FIG. 5, the area in which the first circuit layer (L1) is positioned on the first substrate (SUB1) may be a core area (C/A), and the area in which the second circuit layer (L2) is positioned under the second substrate (SUB2) may be a non-core area (P/A).

For example, a memory cell array (memory cells) or core circuits may be arranged in the core area (C/A). The non-core area (P/A) may also be referred to as a "secondary area" or a "peripheral area", which is different from the core area (C/A) but may overlap the core area (C/A).

In the case of the second vertical structure, one or more monitoring circuits 200 may be arranged in the non-core area (P/A) in which the second circuit layer (L2) is positioned under the second substrate (SUB2). If there are two or more monitoring circuits 200, the two or more monitoring circuits 200 may be distributed and arranged in the non-core area (P/A) in which the second circuit layer (L2) is positioned under the second substrate (SUB2). Since the two or more monitoring circuits 200 have a digital-based structure, it is possible to distribute and arrange two or more monitoring circuits 200 in the non-core area (P/A).

According to the second vertical structure, one or more monitoring circuits 200 arranged in the non-core area (P/A) may not overlap the core circuits (e.g., a memory cell array, primary circuits, etc.) arranged in the core area (C/A) in the vertical direction. Alternatively, all or some of the one or more monitoring circuits 200 arranged in the non-core area (P/A) may overlap the core circuits (e.g., a memory cell array, primary circuits, etc.) arranged in the core area (C/A) in the vertical direction as described with FIG. 7.

Figure 8:
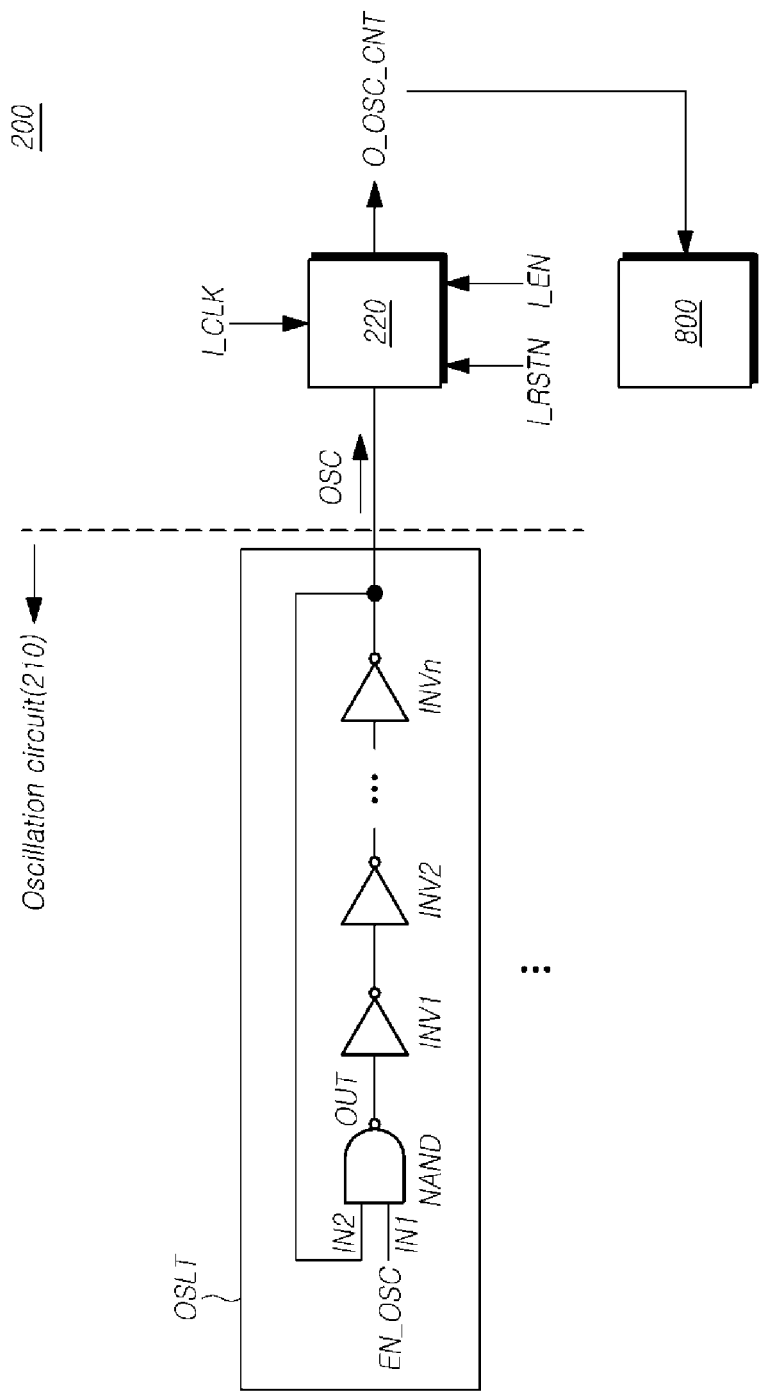
FIG. 8 is a diagram illustrating a configuration of a monitoring circuit according to an embodiment of the present disclosure.

FIG. 8 is a diagram illustrating a configuration of a monitoring circuit 200 according to an embodiment of the present disclosure.

Referring to FIG. 8, the monitoring circuit 200 may include an oscillation circuit 210. The oscillation circuit 210 may include one or more oscillators (OSLT) that generate oscillation signals (OSC) according to input oscillation-enable signals (EN_OSC).

As shown in FIG. 8, each oscillator (OSLT) may be a digital-based ring oscillator.

Each oscillator (OSLT) may include a NAND gate (NAND) and odd-numbered inverters (INV1 to INVn) (where n is an odd number of 1 or more), which are connected in series with the NAND gate (NAND). The NAND gate (NAND) and the odd-numbered inverters (INV1 to INVn) may be implemented using transistors. For example, each of the odd-numbered inverters (INV1 to INVn) may be implemented using a complementary metal-oxide-semiconductor (CMOS) including a p-channel transistor and an n-channel transistor.

Each oscillator (OSLT) may include odd-numbered inverters (INV1 to INVn), thereby generating an oscillation signal (OSC).

The NAND gate (NAND) of each oscillator (OSLT) may include a first input terminal (IN1), a second input terminal (IN2) and an output terminal (OUT). The first input terminal (IN1) may be a terminal to which an oscillation-enable signal (EN_OSC) is input. The second input terminal (IN2) may be electrically connected to an output terminal of the last inverter (INVn), among the odd-numbered inverters (INV1 to INVn). The output terminal (OUT) may be electrically connected to an input terminal of the first inverter (INV1), among the odd-numbered inverters (INV1 to INVn).

Oscillation signals (OSC) generated by one or more oscillators (OSLTs) in the oscillation circuit 210 may be input to the counter 220.

The counter 220 may receive various control signals in order to count the number of rises or the number of falls of the input oscillation signal (OSC).

For example, the various control signals may include a count-enable signal (I_EN) for enabling a counting operation and a clock signal (I_CLK) for controlling a counting operation time. The various control signals may further include a reset (I_RSTN) for resetting the counting operation.

These various control signals may be generated inside the counter 220, or may be generated by a device outside the counter 220. The device outside the counter 220 may be a monitoring controller (not shown) provided inside or outside the monitoring circuit 200. For example, if the semiconductor device 100 is a memory device, the monitoring controller may be a memory controller for controlling the memory device.

If a count-enable signal (I_EN) is input, the counter 220 may count the number of rises or the number of falls of the oscillation signal (OSC) during a time (Tm in FIGS. 12 to 14) determined on the basis of the clock signal (I_CLK).

Further, the monitoring circuit 200 may include a determiner 800. The determiner 800 may output semiconductor process state information of the semiconductor device 100 on the basis of the difference between a count value (O_OSC_CNT) output from the counter 220 and a pre-stored reference value. The pre-stored reference value may correspond to a count value when the semiconductor device 100 is in a desired state or has desired characteristics.

In some cases, the determiner 800 may be provided outside the semiconductor device 100. For example, if the semiconductor device 100 is a memory device, the determiner 800 may be included in the memory controller that controls the memory device.

As described above, the oscillation circuit 210 may include one oscillator (OSLT), or may include two or more oscillators (OSLTs).

In the following description, a monitoring circuit 200 and a monitoring method thereof will be described in relation to the case in which the oscillation circuit 210 includes three oscillators (OSLT1), (OSLT2), and (OSLT3).

Figure 9:
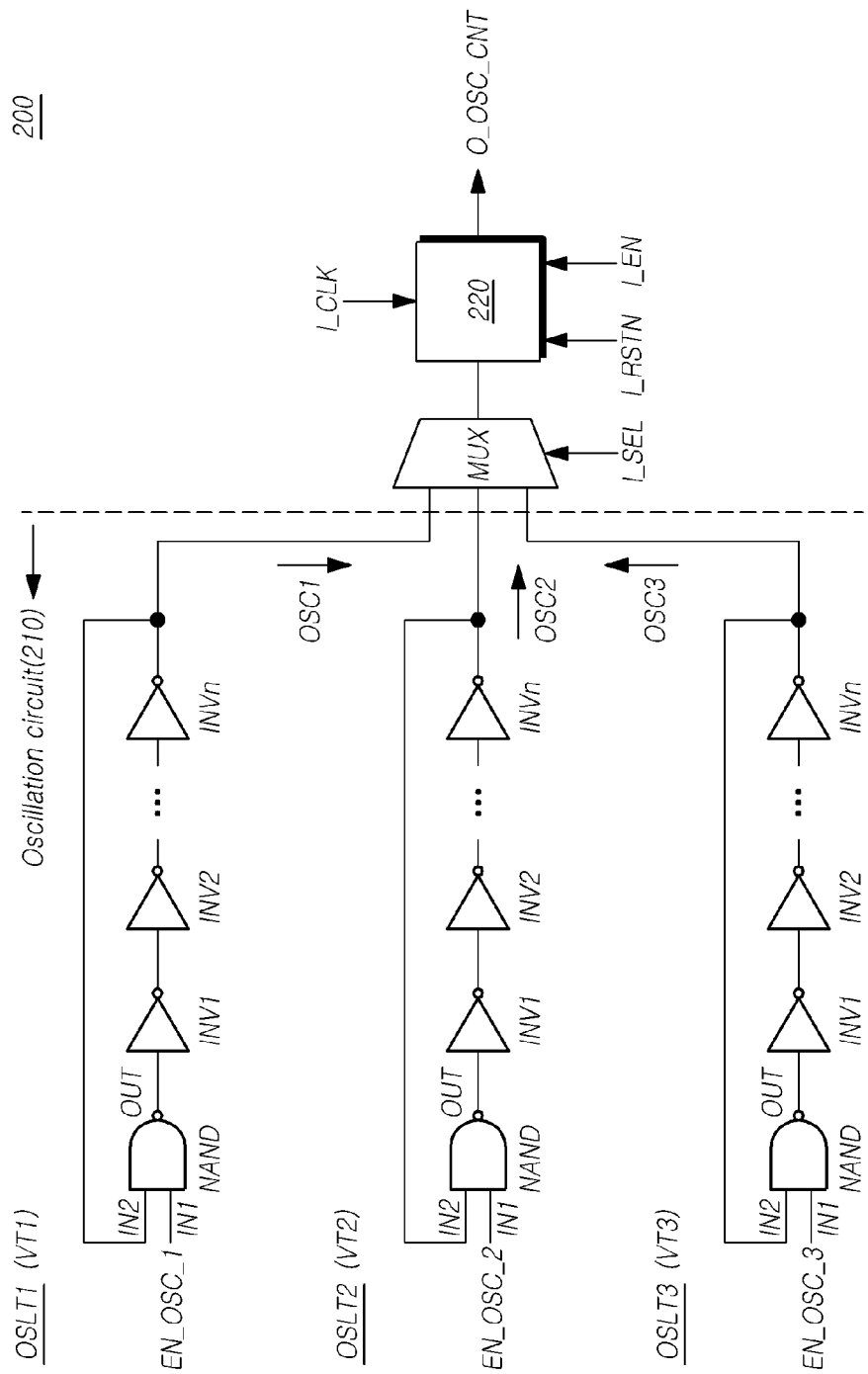
FIG. 9 is a diagram illustrating a configuration of a monitoring circuit according to another embodiment of the present disclosure.
Figure 10:
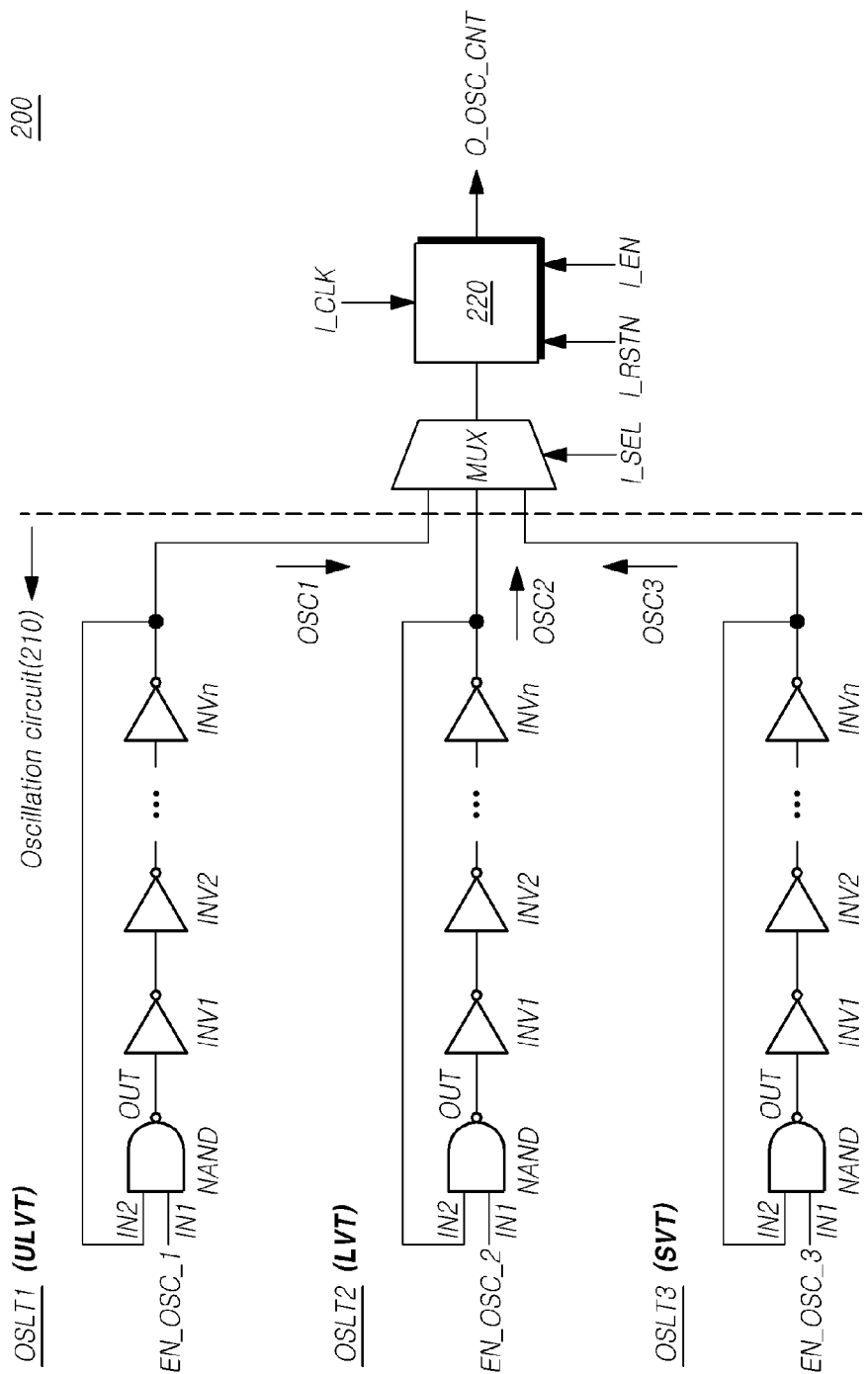
FIG. 10 is a diagram illustrating a configuration of a monitoring circuit according to yet another embodiment of the present disclosure.
Figure 11:
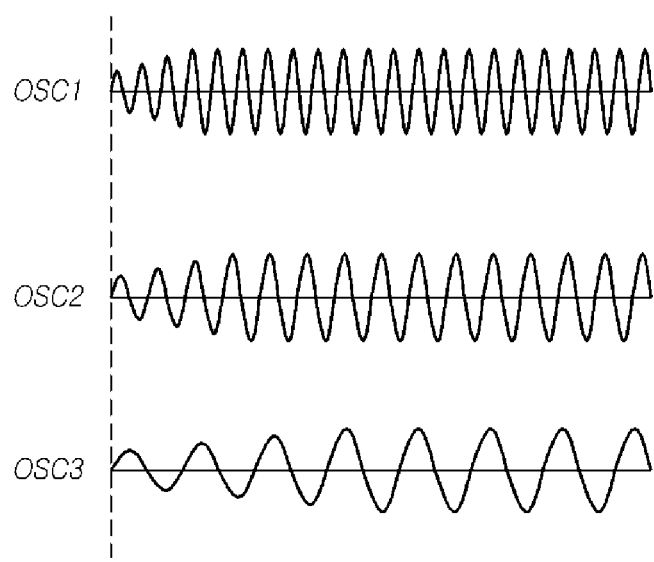
FIG. 11 is a diagram illustrating three oscillation signals in a monitoring circuit according to an embodiment of the present disclosure.

FIG. 9 is a diagram illustrating a configuration of a monitoring circuit 200 according to an embodiment of the present disclosure. FIG. 10 is a diagram illustrating a configuration of a monitoring circuit 200 according to an embodiment of the present disclosure, which may correspond to the example of FIG. 9. FIG. 11 is a diagram illustrating three oscillation signals (OSC1), (OSC2), and (OSC3) in the monitoring circuit 200 according to an embodiment of the present disclosure.

Referring to FIG. 9, the oscillation circuit 210 in the monitoring circuit 200 may include two or more oscillators (OSLT1), (OSLT2), and (OSLT3).

The two or more oscillators (OSLT1), (OSLT2), and (OSLT3) may have different threshold voltage levels. Accordingly, the rising and falling characteristics of the oscillation signals (OSC1), (OSC2), and (OSC3), which are generated by the respective oscillators of the two or more oscillators (OSLT1), (OSLT2), and (OSLT3), may be different from each other.

Therefore, the number of risings and/or the number of fallings of the oscillation signals (OSC1), (OSC2), and (OSC3), which are generated by the two or more oscillators (OSLT1), (OSLT2), and (OSLT3) during the same time, may be different from each other.

The two or more oscillators (OSLT1), (OSLT2), and (OSLT3) in the oscillation circuit 210 may have the same number of odd-numbered inverters (INV1 to INVn). Alternatively, the number of odd-numbered inverters (INV1 to INVn) in at least one of the two or more oscillators (OSLT1), (OSLT2), and (OSLT3) may be different from the number of odd-numbered inverters (INV1 to INVn) in other oscillators.

The two or more oscillators (OSLT1), (OSLT2), and (OSLT3) in the oscillation circuit 210 may generate two or more oscillation signals (OSC1), (OSC2), and (OSC3) at different timings according to oscillation-enable signals (EN_OSC_1), (EN_OSC_2), and (EN_OSC_3), which are input at different timings. That is, the two or more oscillators (OSLT1), (OSLT2), and (OSLT3) may be respectively enabled at different timings to generate the oscillation signals (OSC1), (OSC2), and (OSC3).

Further, the monitoring circuit 200 may include a multiplexer (MUX) for selecting and transmitting one of the oscillation signal (OSC1), (OSC2), and (OSC3) to the counter 220 according to a selection signal (I_SEL).

The multiplexer (MUX) may select one of the main output terminals (or oscillation signal output terminals) of the two or more oscillators (OSLT1), (OSLT2), and (OSLT3) according to the selection signal (I_SEL). The multiplexer (MUX) may electrically connect the same to the input terminal of the counter 220.

For this multiplexing, the selection signal (I_SEL) may selectively indicate one of the two or more oscillators (OSLT1), (OSLT2), and (OSLT3).

The selection signal (I_SEL) is one of the various control signals described above. The selection signal (I_SEL) may be generated inside the counter 220, or may be generated by a device outside the counter 220. The device outside the counter 220 may be a monitoring controller (not shown) provided inside or outside the monitoring circuit 200. If the semiconductor device 100 is a memory device, the monitoring controller may be a memory controller for controlling the memory device.

As described above, in order for two or more oscillators (OSLT1), (OSLT2), and (OSLT3) to be enabled at different timings and to generate two or more oscillation signals (OSC1), (OSC2), and (OSC3) at different timings, the input timings of the respective oscillation-enable signals (EN_OSC_1), (EN_OSC_2), and (EN_OSC_3) must be controlled to be different from each other. For example, the first oscillator (OSLT1) may receive a first oscillation-enable signal (EN_OSC_1) at a first input timing. The second oscillator (OSLT2) may receive a second oscillation-enable signal (EN_OSC_2) at a second input timing. The third oscillator (OSLT3) may receive a third oscillation-enable signal (EN_OSC_3) at a third input timing. The first to third input timings are different from each other.

Unlike the above case in which two or more oscillators (OSLT1), (OSLT2), and (OSLT3) are enabled at different timings to generate two or more oscillation signals (OSC1), (OSC2), and (OSC3) at different timings as described above, two or more oscillators (OSLT1), (OSLT2), and (OSLT3) may be enabled at the same time to generate two or more oscillation signals (OSC1), (OSC2), and (OSC3) at the same time. Alternatively, two or more oscillators (OSLT1), (OSLT2), and (OSLT3) may be enabled independently to generate two or more oscillation signals (OSC1), (OSC2), and (OSC3) independently.

In this case, the monitoring circuit 200 does not need to include the multiplexer (MUX). Instead, the monitoring circuit 200 must include two or more counters 220 corresponding to two or more oscillators (OSLT1), (OSLT2), and (OSLT3).

The monitoring circuit 200 may include an oscillation circuit 210 and a counter 220. The oscillation circuit 210 may include a first oscillator (OSLT1) for generating a first oscillation signal (OSC1) according to input of a first oscillation-enable signal (EN_OSC_1) and a second oscillator (OSLT2) for generating a second oscillation signal (OSC2) according to input of second oscillation-enable signal (EN_OSC_2). The counter 220 may count the number of rises or the number of falls of each of the first oscillation signal (OSC1) and the second oscillation signal (OSC2).

Further, the oscillation circuit 210 may include a third oscillator (OSLT3) for generating a third oscillation signal (OSC3) according to input of a third oscillation-enable signal (EN_OSC_3).

In an embodiment of the present disclosure, the first oscillator (OSLT1) has a first threshold voltage level (VT1), which may mean that a NAND gate (NAND) and transistors constituting the odd-numbered inverters (INV1 to INVn) in the first oscillator (OSLT1) have a first threshold voltage level (VT1). The second oscillator (OSLT2) has a second threshold voltage level (VT2), which may mean that a NAND gate (NAND) and transistors constituting the odd-numbered inverters (INV1 to INVn) in the second oscillator (OSLT2) have a second threshold voltage level (VT2). The third oscillator (OSLT3) has a third threshold voltage level (VT3), which may mean that a NAND gate (NAND) and transistors constituting the odd-numbered inverters (INV1 to INVn) in the third oscillator (OSLT3) have a third threshold voltage level (VT3).

The first oscillator (OSLT1) may generate a first oscillation signal (OSC1) corresponding to the first threshold voltage level (VT1). The second oscillator (OSLT2) may generate a second oscillation signal (OSC2) corresponding to the second threshold voltage level (VT2). The third oscillator (OSLT3) may generate a third oscillation signal (OSC3) corresponding to the third threshold voltage level (VT3).

The first threshold voltage level (VT1), the second threshold voltage level (VT2), and the third threshold voltage level (VT3) may be different from each other.

Threshold voltage levels, such as the first threshold voltage level (VT1), the second threshold voltage level (VT2), and the third threshold voltage level (VT3) may be in the voltage range between a lower limit value and an upper limit value.

The voltage range of the first threshold voltage level (VT1), the voltage range of the second threshold voltage level (VT2), and the voltage range of the third threshold voltage level (VT3) may not overlap each other at all, or some thereof may overlap each other.

The second threshold voltage level (VT2) of the second oscillator (OSLT2) may be greater than the first threshold voltage level (VT1) of the first oscillator (OSLT1). The third threshold voltage level (VT3) of the third oscillator (OSLT3) may be greater than the second threshold voltage level (VT2) of the second oscillator (OSLT2).

That is, the third threshold voltage level (VT3) may be the highest, the second threshold voltage level (VT2) may be the next highest, and the first threshold voltage level (VT1) may be the lowest. Here, the low voltage range may mean that the lower limit of the voltage range is the lowest.

In an embodiment, as shown in FIG. 11, the number of rises or the number of falls of the first oscillation signal (OSC1) may be greater than the number of rises or the number of falls of the second oscillation signal (OSC2). The first oscillation signal (OSC1) may be generated by the first oscillator (OSLT1) having the first threshold voltage level (VT1). The second oscillation signal (OSC2) may be generated by the second oscillator (OSLT2) having the second threshold voltage level (VT2). That is, the first threshold voltage level (VT1) may be less than the second threshold voltage level (VT2), and the number of rises or the number of falls of the first oscillation signal (OSC1) may be greater than the number of rises or the number of falls of the second oscillation signal (OSC2).

The number of rises or the number of falls of the second oscillation signal (OSC2) may be greater than the number of rises or the number of falls of the third oscillation signal (OSC3). The third oscillation signal (OSC3) may be generated by the third oscillator (OSLT3) having the third threshold voltage level (VT3). That is, the second threshold voltage level (VT2) may be less than the third threshold voltage level (VT3), and the number of rises or the number of falls of the second oscillation signal (OSC2) may be greater than the number of rises or the number of falls of the third oscillation signal (OSC3).

According to the above description, referring to FIG. 11, the first oscillation signal (OSC1) may be generated by the first oscillator (OSLT1), the second oscillation signal (OSC2) may be generated by the second oscillator (OSLT2), and the third oscillation signal (OSC3) may be generated by the third oscillator (OSLT3). Among the first oscillation signal (OSC1), the second oscillation signal (OSC2), and the third oscillation signal (OSC3), the number of rises or the number of falls of the first oscillation signal (OSC1) may be the largest, the number of rises or the number of falls of the second oscillation signal (OSC2) may be the next largest, and the number of rises or the number of falls of the third oscillation signal (OSC3) may be the smallest.

According to the description above, the oscillator having a higher threshold voltage level among the two or more oscillators (OSLT1), (OSLT2), and (OSLT3) may generate an oscillation signal having a smaller number of rises or fallings. The oscillator having a lower threshold voltage level among the two or more oscillators (OSLT1), (OSLT2), and (OSLT3) may generate an oscillation signal having a larger number of rises or fallings. That is, the threshold voltage level and the number of rises or falls of the oscillation signal may be in inverse proportion to each other.

Referring back to FIG. 8, the determiner 800 may compare a first count value (O_OSC_CNT) for the number of rises or the number of falls of the first oscillation signal (OSC1), which is generated by the first oscillator (OSLT1), with a reference value corresponding thereto. Further, the determiner 800 may output semiconductor process state information of the semiconductor device 100 on the basis of the difference corresponding to the comparison result.

If the difference is greater than or equal to a predetermined value, the determiner 800 may determine that there is a problem with a state or a characteristic of the elements (e.g., transistors or the like) having the first threshold voltage level (VT1) in the semiconductor device 100, and may output semiconductor process state information indicating the determination result.

The determiner 800 may compare a second count value (O_OSC_CNT) for the number of rises or the number of falls of the second oscillation signal (OSC2), which is generated by the second oscillator (OSLT2), with a reference value corresponding thereto. Further, the determiner 800 may output semiconductor process state information of the semiconductor device 100 on the basis of the difference corresponding to the comparison result.

If the difference is greater than or equal to a predetermined value, the determiner 800 may determine that there is a problem with the state or characteristics of the elements (e.g., transistors or the like) having the second threshold voltage level (VT2) in the semiconductor device 100. Further, the determiner 800 may output semiconductor process state information indicating the determination result.

The determiner 800 may compare a third count value (O_OSC_CNT) for the number of rises or the number of falls of the third oscillation signal (OSC3), which is generated by the third oscillator (OSLT3), with a reference value corresponding thereto. Further, the determiner 800 may output semiconductor process state information of the semiconductor device 100 on the basis of the difference corresponding to the comparison result.

If the difference is greater than or equal to a predetermined value, the determiner 800 may determine that there is a problem with the state or characteristics of the elements (e.g., transistors or the like) having the third threshold voltage level (VT3) in the semiconductor device 100. Further, the determiner 800 may output semiconductor process state information indicating the determination result.

In some embodiments, the first threshold voltage level (VT1), the second threshold voltage level (VT2), and the third threshold voltage level (VT3) may be three different threshold voltage levels, among an ultra-low threshold voltage (ULVT) level, a low threshold voltage (LVT) level, a standard threshold voltage (SVT) level, and a high threshold voltage (HVT) level. The standard threshold voltage (SVT) level is called a "regular threshold voltage (RVT) level".

For example, as shown in FIGS. 9 and 10, the first threshold voltage level (VT1) may be an ultra-low threshold voltage (ULVT) level, the second threshold voltage level (VT2) may be a low threshold voltage (LVT) level, and the third threshold voltage level (VT3) may be a standard threshold voltage (SVT) level. The monitoring circuit 200 in this case is the same as shown in FIG. 10.

The performance or characteristics of the transistors and the semiconductor device 100 including the same may vary depending on the high or low threshold voltage level. For example, a transistor having a relatively high threshold voltage level has a low operating speed and low power consumption. A transistor having a relatively low threshold voltage level has a high operating speed and high power consumption.

Figure 12:
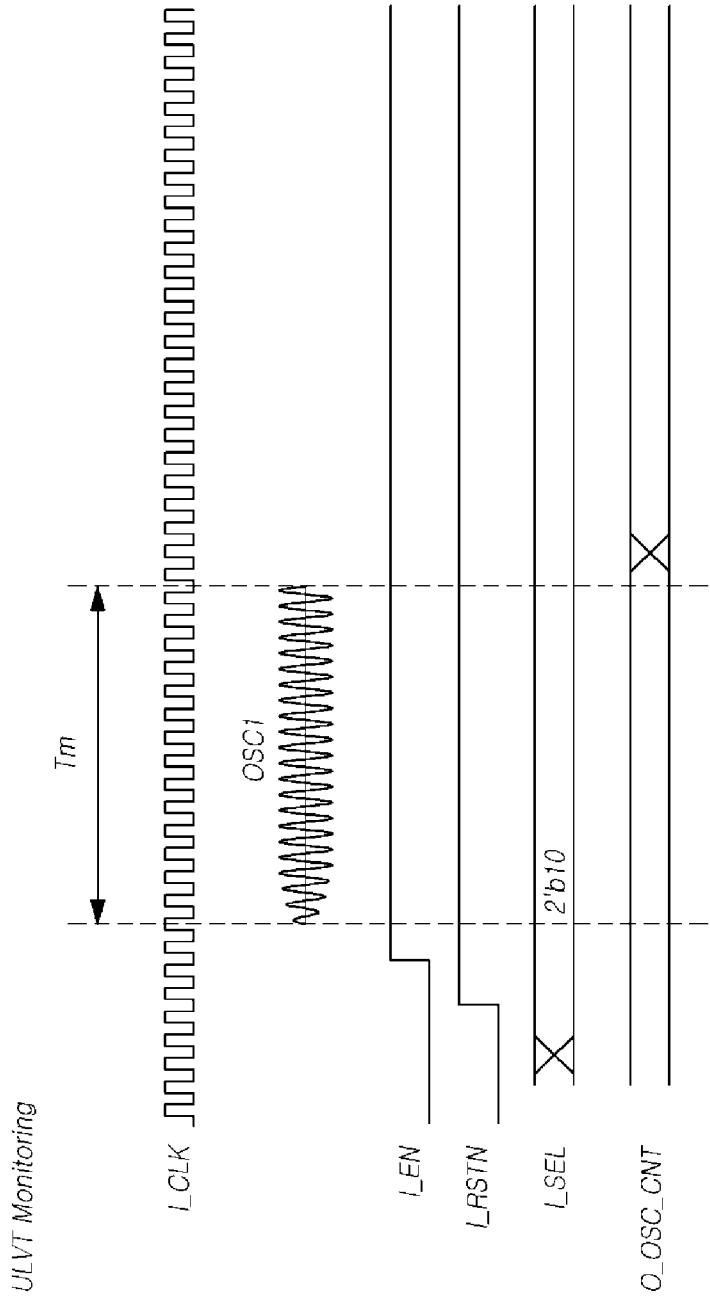
FIGS. 12 to 14 are timing diagrams for ULVT monitoring, LVT monitoring, and SVT monitoring, respectively, using the monitoring circuit of FIG. 10.
Figure 13:
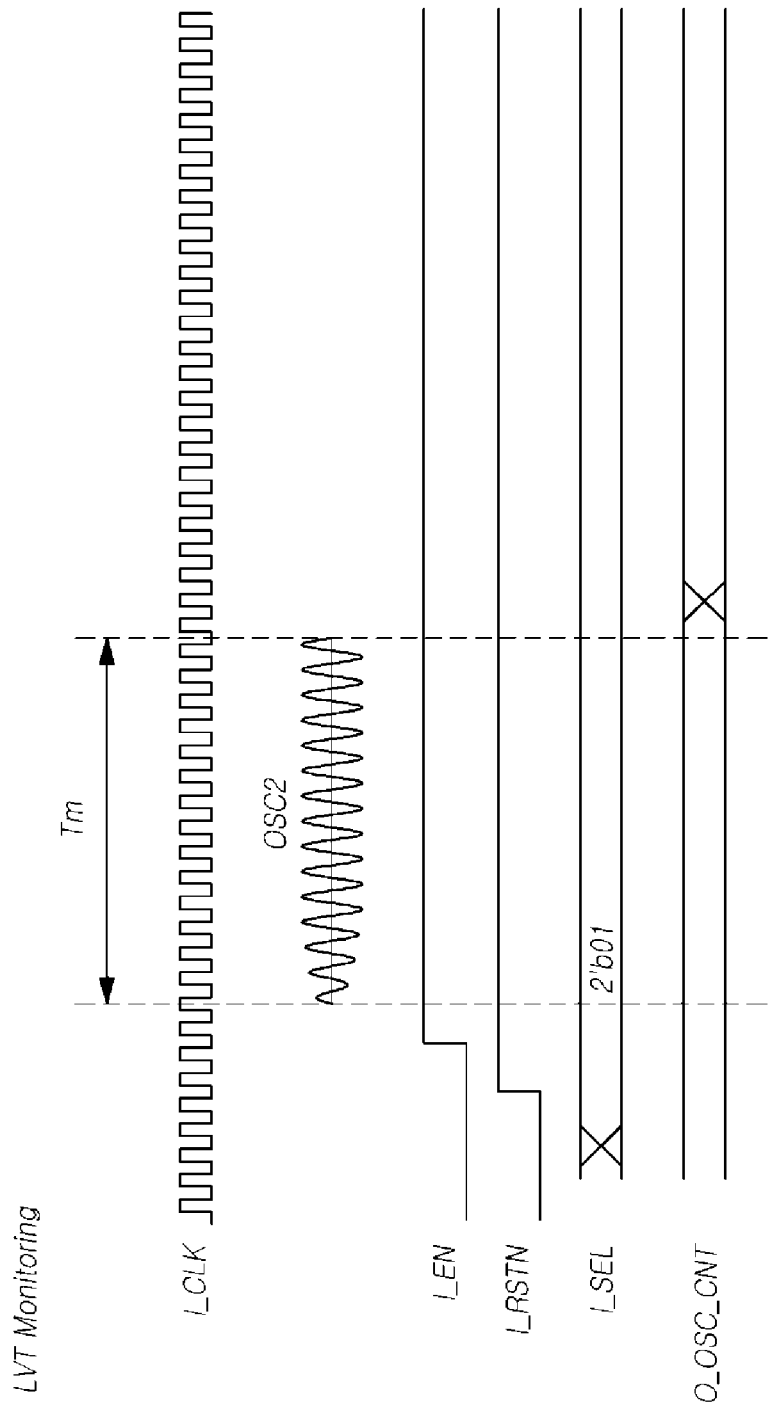
Figure 14:
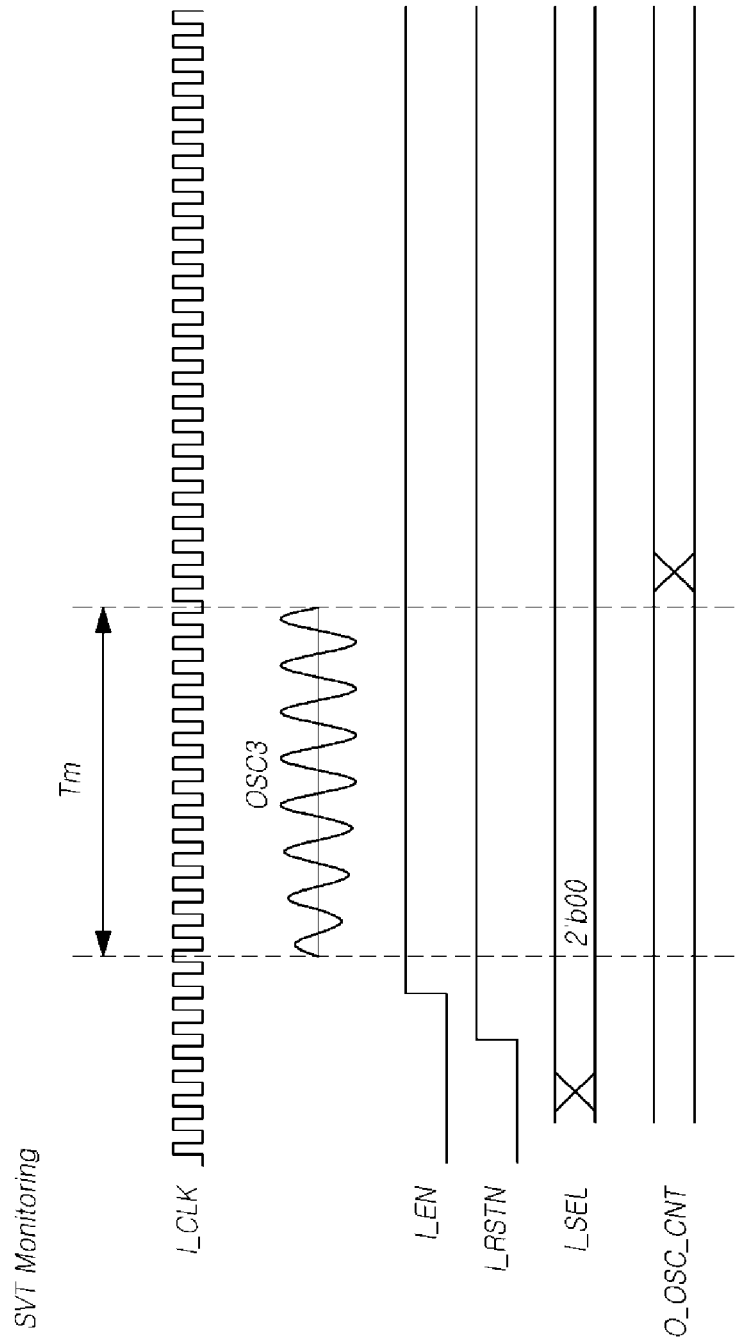

FIGS. 12 to 14 show timing diagrams when performing ULVT monitoring, LVT monitoring, and SVT monitoring using the monitoring circuit 200 shown in FIG. 10.

Referring to FIG. 12, for the monitoring circuit 200 to perform ULVT monitoring, among the first oscillation-enable signal (EN_OSC_1), the second oscillation-enable signal (EN_OSC_2), and the third oscillation-enable signal (EN_OSC_3), only the first oscillation-enable signal (EN_OSC_1) has an enabled state and the others have a disabled state. For example, the enabled state may correspond to a value of 0 and the disabled state may correspond to a value of 1, or the enabled state may correspond to a value of 1 and the disabled state may correspond to a value of 0.

Accordingly, the first oscillator (OSLT1) in the oscillation circuit 210 is enabled to generate the first oscillation signal (OSC1).

The multiplexer (MUX) receives a selection signal (I_SEL) indicating the first oscillator (OSLT1), selects the first oscillation signal (OSC1) based on the selection signal (I_SEL) and transmits, to the counter 220, the first oscillator signal (OSC1). The first oscillation signal (OSC1) is generated by the first oscillator (OSLT1), among the first to third oscillators (OSLT1), (OSLT2), and (OSLT3).

In the example shown in FIG. 12, the selection signal (I_SEL) indicating the first oscillator (OSLT1) or the first oscillation signal (OSC1) may have a value of 2'b10.

If a reset signal (I_RSTN) is in a non-reset state, and if a count-enable signal (I_EN) is input in a count-enabled state, the counter 220 may count the number of rises or the number of falls of the first oscillation signal (OSC1) during a time (Tm) determined on the basis of the clock signal (I_CLK).

The non-reset state of the reset signal (I_RSTN) may be a high level, and the reset state of the reset signal (I_RSTN) may be a low level. In some cases, the non-reset state of the reset signal (I_RSTN) may be a low level, and the reset state of the reset signal (I_RSTN) may be a high level.

The count-enabled state of the count-enable signal (I_EN) may be a high level, and the count-disabled state of the count-enable signal (I_EN) may be a low level. In some cases, the count-enabled state of the count-enable signal (I_EN) may be a low level, and the count-disabled state of the count-enable signal (I_EN) may be a high level.

Referring to FIG. 13, for the monitoring circuit 200 to perform LVT monitoring, among the first oscillation-enable signal (EN_OSC_1), the second oscillation-enable signal (EN_OSC_2), and the third oscillation-enable signal (EN_OSC_3), only the second oscillation-enable signal (EN_OSC_2) has an enabled state and the others have a disabled state. For example, the enabled state may correspond to a value of 0 and the disabled state may correspond to a value of 1, or the enabled state may correspond to a value of 1 and the disabled state may correspond to a value of 0.

Accordingly, the second oscillator (OSLT2) in the oscillation circuit 210 may be enabled to generate the second oscillation signal (OSC2).

The multiplexer (MUX) receives a selection signal (I_SEL) indicating the second oscillator (OSLT2), selects the second oscillation signal (OSC2) based on the selection signal (I_SEL) and transmits, to the counter 220, the second oscillator signal (OSC2). The second oscillator signal (OSC2) is generated by the second oscillator (OSLT2), among the first to third oscillators (OSLT1), (OSLT2), and (OSLT3).

In the example shown in FIG. 13, the selection signal (I_SEL) indicating the second oscillator (OSLT2) or the second oscillation signal (OSC2) may have a value of 2'b01.

If a reset signal (I_RSTN) is in a non-reset state, and if a count-enable signal (I_EN) is input in a count-enabled state, the counter 220 may count the number of rises or the number of falls of the second oscillation signal (OSC2) during a time (Tm) determined on the basis of the clock signal (I_CLK).

Referring to FIG. 14, for the monitoring circuit 200 to perform LVT monitoring, among the first oscillation-enable signal (EN_OSC_1), the second oscillation-enable signal (EN_OSC_2), and the third oscillation-enable signal (EN_OSC_3), only the third oscillation-enable signal (EN_OSC_3) has an enabled state and the others have a disabled state. For example, the enabled state may correspond to a value of 0 and the disabled state may correspond to a value of 1, or the enabled state may correspond to a value of 1 and the disabled state may correspond to a value of 0.

Accordingly, the third oscillator (OSLT3) in the oscillation circuit 210 is enabled to generate the third oscillation signal (OSC3).

The multiplexer (MUX) receives a selection signal (I_SEL) indicating the third oscillator (OSLT3), selects the third oscillation signal (OSC3) based on the selection signal (I_SEL) and transmits, to the counter 220, the third oscillator signal (OSC3). The third oscillator signal (OSC3) is generated by the third oscillator (OSLT3), among the first to third oscillators (OSLT1), (OSLT2), and (OSLT3).

In the example shown in FIG. 14, the selection signal (I_SEL) indicating the third oscillator (OSLT3) or the third oscillation signal (OSC3) may have a value of 2'b00.

If a reset signal (I_RSTN) is in a non-reset state, and if a count-enable signal (I_EN) is input in a count-enabled state, the counter 220 may count the number of rises or the number of falls of the third oscillation signal (OSC3) during a time (Tm) determined on the basis of the clock signal (I_CLK).

Figure 15:
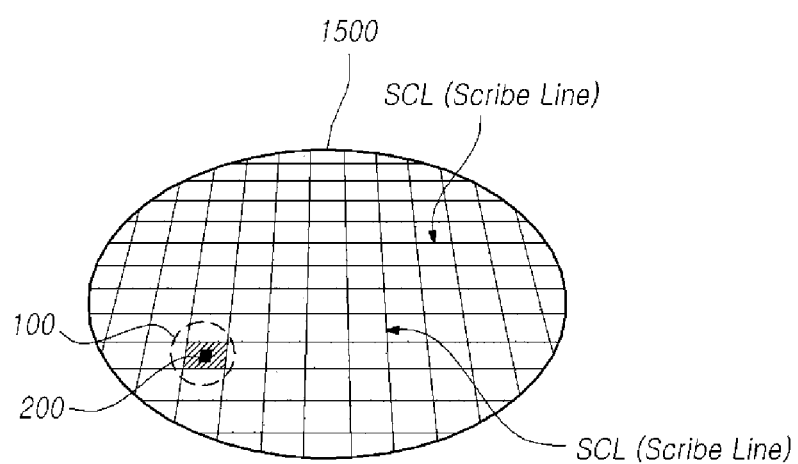
FIG. 15 is a diagram illustrating the state in which a semiconductor device including a monitoring circuit is implemented on a wafer according to an embodiment of the present disclosure.

FIG. 15 is a diagram illustrating the state in which a semiconductor device 100 including a monitoring circuit 200 is implemented on a wafer 1500 serving as a substrate (SUB) according to an embodiment of the present disclosure.

Referring to FIG. 15, in semiconductor processing, a circuit (i.e., integrated circuit) is arranged on the surface of the wafer 1500. The wafer 1500 having the integrated circuit arranged thereon is cut along scribe lines (SCL) into a predetermined size. As a result of the cutting, chips having a unit size are obtained. Each chip manufactured as described above may correspond to the semiconductor device 100 or the state before completion of manufacturing the same according to an embodiment of the present disclosure.

Since the semiconductor device 100 must include the monitoring circuit 200, the monitoring circuit 200 is also arranged when the integrated circuit is arranged on the wafer surface before the scribing process.

The monitoring circuit 200 may be provided in the chip area, instead of being provided on the scribe lines (SCL), so as to be included in the semiconductor device 100 corresponding to one chip.

Accordingly, it is possible to accurately recognize the characteristics, the performance, or the state of each semiconductor device 100. In addition, it is possible to check whether or not the overall semiconductor processing is performing well for each semiconductor device 100.

The operation of the monitoring circuit 200 may be performed before and after the scribing process.

In addition, since the monitoring circuit 200 is included in the semiconductor device 100 corresponding to one chip, it is possible to execute a monitoring function of the monitoring circuit 200 even when the semiconductor device 100 is mounted to a variety of electronic devices such as a PC, and a smart phone so as to be operable after production thereof is completed.

Since the monitoring circuit 200 monitors the state, characteristics, or performance of the semiconductor device 100 using the digital-based oscillation circuit 210 and counter 220, the monitoring circuit 200 is less affected by the environment, compared with analog-based monitoring, thereby obtaining more accurate monitoring results and performing faster monitoring.

Since the monitoring circuit 200 is made on the basis of transistors having a small size, the monitoring circuit 200 may be accurately arranged at various positions (e.g., corners) in the semiconductor device 100 without limitation.

Hereinafter, a memory device in which the semiconductor device 100 is a memory semiconductor will be described with reference to FIG. 16. In addition, a memory controller for controlling the operation of the memory device will be described with reference to FIG. 17.

Figure 16:
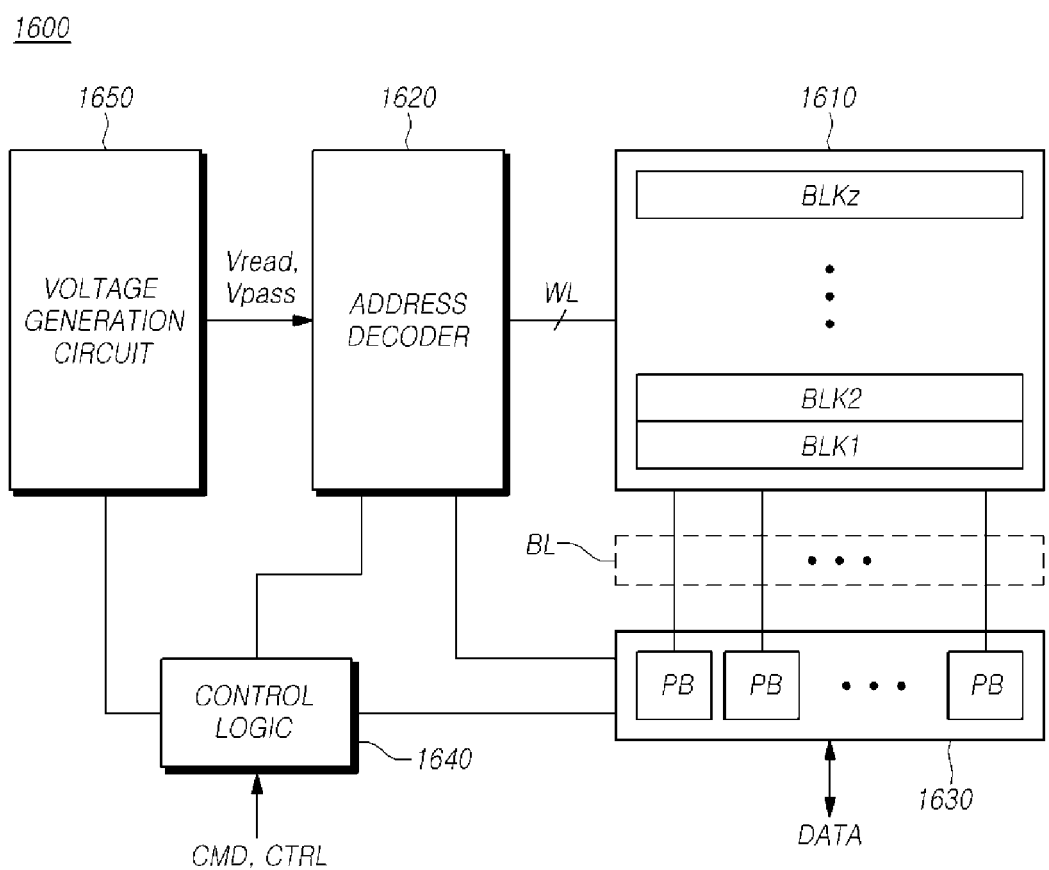
FIG. 16 is a diagram schematically illustrating a memory device according to an embodiment of the present disclosure.
Figure 17:
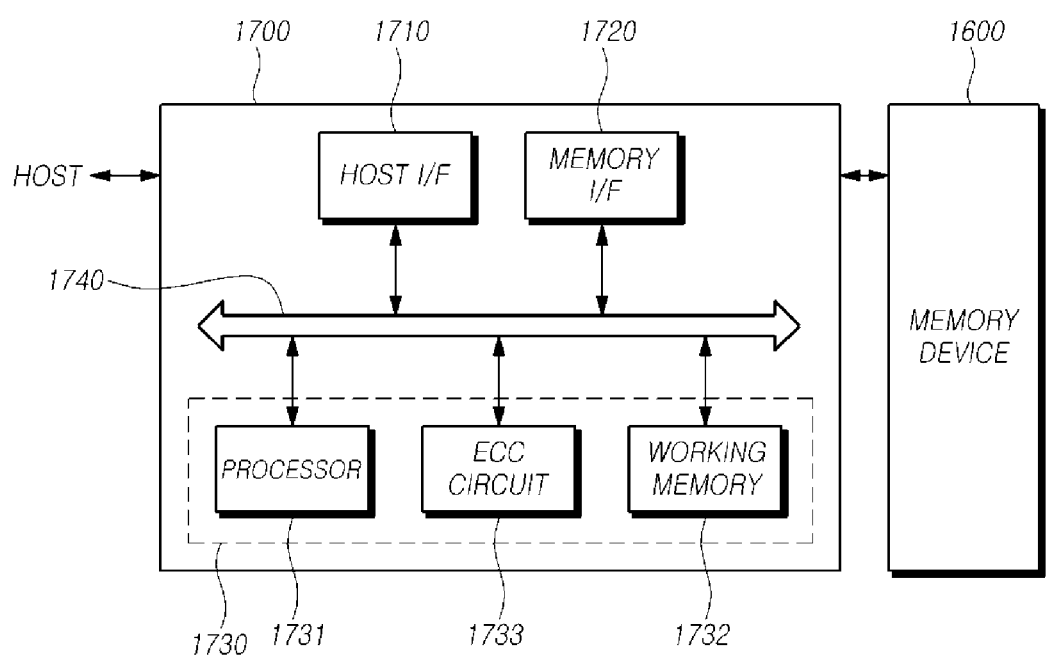
FIG. 17 is a diagram illustrating a memory system including a memory device and a memory controller according to an embodiment of the present disclosure.

FIG. 16 is a diagram schematically illustrating a memory device 1600 according to an embodiment of the present disclosure. FIG. 17 is a diagram illustrating a memory system including a memory device 1600 and a memory controller 1700 according to an embodiment of the present disclosure.

Referring to FIG. 16, the memory device 1600 may include a memory cell array 1610, an address decoder 1620, a read-and-write circuit 1630, a control logic 1640, and a voltage generation circuit 1650.

The memory cell array 1610 may include a plurality of memory blocks (BLK1) to (BLKz) (where z is a natural number of 2 or more).

In the plurality of memory blocks (BLK1) to (BLKz), a plurality of word lines (WL) and a plurality of bit lines (BL) may be disposed, and a plurality of memory cells (MC) may be arranged.

The plurality of memory blocks (BLK1) to (BLKz) may be connected to the address decoder 1620 through the plurality of word lines (WL). The plurality of memory blocks (BLK1) to (BLKz) may be connected to the read-and-write circuit 1630 through the plurality of bit lines (BL).

Each of the plurality of memory blocks (BLK1) to (BLKz) may include a plurality of memory cells. For example, the plurality of memory cells may be nonvolatile memory cells having a vertical channel structure.

The memory cell array 1610 may be configured as a memory cell array having a two-dimensional structure. Alternatively, in some cases, the memory cell array 1610 may be configured as a memory cell array having a three-dimensional structure.

Each of the plurality of memory cells in the memory cell array 1610 may store at least one bit of data. For example, each of the plurality of memory cells in the memory cell array 1610 may be a single-level cell (SLC) that stores one bit of data. As another example, each of the plurality of memory cells in the memory cell array 1610 may be a multi-level cell (MLC) that stores two bits of data. As another example, each of the plurality of memory cells in the memory cell array 1610 may be a triple-level cell (TLC) that stores three bits of data. As another example, each of the plurality of memory cells in the memory cell array 1610 may be a quad-level cell (QLC) that stores 4 bits of data. As another example, the memory cell array 1610 may include a plurality of memory cells each storing five or more bits of data.

The address decoder 1620, the read-and-write circuit 1630, the control logic 1640, and the voltage generation circuit 1650 may operate as peripheral circuits for driving the memory cell array 1610.

The address decoder 1620 may be connected to the memory cell array 1610 through a plurality of word lines (WL).

The address decoder 1620 may be configured to operate in response to the control of the control logic 1640.

The address decoder 1620 may receive addresses through an input/output buffer inside the memory device 1600. The address decoder 1620 may be configured to decode a block address, among the received addresses. The address decoder 1620 may select at least one memory block according to the decoded block address.

The address decoder 1620 may receive a read voltage (Vread) and a pass voltage (Vpass) from the voltage generation circuit 1650.

When applying a read voltage during a read operation, the address decoder 1620 may apply a read voltage (Vread) to a selected word line (WL) in a selected memory block, and may apply a pass voltage (Vpass) to the remaining unselected word lines (WL).

In a program verification operation, the address decoder 1620 may apply a verification voltage generated by the voltage generation circuit 1650 to a selected word line (WL) in the selected memory block, and may apply a pass voltage (Vpass) to the remaining unselected word lines (WL).

The address decoder 1620 may be configured to decode column addresses of the received addresses. The address decoder 1620 may transmit the decoded column addresses to the read-and-write circuit 1630.

The read operation and the program operation of the memory device 1600 may be performed in units of pages. The address received when requesting the read operation and the program operation may include at least one of a block address, a row address, and a column address.

The address decoder 1620 may select one memory block and one word line according to the block address and the row address. The column address may be decoded by the address decoder 1620 so as to be provided to the read-and-write circuit 1630.

The address decoder 1620 may include at least one of a block decoder, a row decoder, a column decoder, and an address buffer.

The read-and-write circuit 1630 may include a plurality of page buffers (PB). The read-and-write circuit 1630 may operate as a "read circuit" during the read operation of the memory cell array 1610, and may operate as a "write circuit" during the write operation thereof.

The read-and-write circuit 1630 may also be referred to as a "page buffer circuit" or a "data register circuit" including a plurality of page buffers (PB). Here, the read-and-write circuit 1630 may include a data buffer for a function of data processing, and in some cases, may further include a cache buffer for a caching function.

A plurality of page buffers (PB) may be connected to the memory cell array 1610 through a plurality of bit lines (BL). In order to sense threshold voltages (Vths) of the memory cells during the read operation and the program verification operation, the plurality of page buffers (PB) may continue to supply a sensing current to the bit lines (BL) connected to the memory cells, and may detect a change in the amount of current flowing according to the program state of the corresponding memory cell through a sensing node to then be latched as sensing data.

The read-and-write circuit 1630 may operate in response to page buffer control signals output from the control logic 1640.

In the read operation, the read-and-write circuit 1630 reads data of the memory cell, temporarily stores the read data, and then outputs the data (DATA) to the input/output buffer of the memory device 1600. In an embodiment, the read-and-write circuit 1630 may include a column selection circuit, as well as the page buffers (PBs) or page registers.

The control logic 1640 may be connected to the address decoder 1620, the read-and-write circuit 1630, and the voltage generation circuit 1650. The control logic 1640 may receive a command (CMD) and a control signal (CTRL) through an input/output buffer (not shown) of the memory device 1600.

The control logic 1640 may be configured to control the overall operation of the memory device 1600 in response to the control signal (CTRL). The control logic 1640 may output a control signal for adjusting the pre-charge potential levels of the sensing nodes of the plurality of page buffers (PB).

The control logic 1640 may control the read-and-write circuit 1630 to perform a read operation of the memory cell array 1610. The voltage generation circuit 1650 may generate a read voltage (Vread) and a pass voltage (Vpass) used in the read operation in response to the voltage generation circuit control signal output from the control logic 1640.

Referring to FIG. 17, the memory system may include a memory device 1600 for storing data, and a memory controller 1700 for controlling the memory device 1600.

The memory device 1600 includes a plurality of memory blocks and operates in response to the control of the memory controller 1700. In this case, the operation of the memory device 1600 may include, for example, a read operation, a program operation (also, referred to as a "write operation"), and an erasure operation.

The memory device 1600 may include a memory cell array including a plurality of memory cells (hereinafter, simply referred to as "cells") that store data. Such a memory cell array may exist inside the memory block.

For example, the memory device 1600 may be implemented as various types, such as double-data-rate synchronous dynamic random access memory (DDR SDRAM), low-power double data rate 4 (LPDDR4) SDRAM, graphics double-data-rate (GDDR) SDRAM, a low-power DDR (LPDDR), Rambus dynamic random access memory (RDRAM), NAND flash memory, vertical NAND, NOR flash memory, resistive random access memory (RRAM), phase-change memory (PRAM), magnetoresistive random access memory (MRAM), ferroelectric random access memory (FRAM), and spin transfer torque random access memory (STT-RAM).

The memory device 1600 may be implemented as a three-dimensional array structure. Embodiments of the disclosure may be applied to a charge trap flash (CTF) in which a charge storage layer is formed of an insulating film, as well as to a flash memory device in which the charge storage layer is formed of a conductive floating gate.

The memory device 1600 is configured to receive a command, and an address from the memory controller 1700, and to access an area selected by an address in the memory cell array. That is, the memory device 1600 may perform an operation corresponding to a command on the area selected by the address.

For example, the memory device 1600 may perform a program operation, a read operation, and an erasure operation. In this regard, during the program operation, the memory device 1600 may program data in the area selected by the address. In the read operation, the memory device 1600 may read data from the area selected by the address. In the erasure operation, the memory device 1600 may erase data stored in the area selected by the address.

The memory controller 1700 may control write (or program), read, erase, and background operations on the memory device 1600. The background operation may include, for example, at least one of garbage collection (GC), wear levelling (WL), and bad block management (BBM).

The memory controller 1700 may control the operation of the memory device 1600 according to a request of a host (HOST). Alternatively, the memory controller 1700 may control the operation of the memory device 1600, independently of any request from a host (HOST).

The memory controller 1700 and the host (HOST) may be separate devices. In some cases, the memory controller 1700 and the host (HOST) may be integrated into one device. In the following description, the memory controller 1700 and the host (HOST) will be described as being separate from each other.

In some embodiments, the memory controller 1700 may include a memory interface (I/F) 1720, and a control circuit 1730. Further, the memory controller 1700 may include a host interface (I/F) 1710.

The host interface 1710 provides an interface for communication with the host (HOST).

The control circuit 1730 may receive a command from the host (HOST) through the host interface 1710, and may process the received command.

The memory interface 1720 is connected to the memory device 1600 to provide an interface for communication with the memory device 1600. That is, the memory interface 1720 may be configured to provide an interface between the memory device 1600 and the memory controller 1700 in response to the control of the control circuit 1730.

The control circuit 1730 performs the overall control operation of the memory controller 1700, thereby controlling the memory device 1600. The control circuit 1730 may include at least one of a processor 1731, and a working memory 1732. In some cases, the control circuit 1730 may further include an error detection and correction circuit (or ECC circuit) 1733.

The processor 1731 may control the overall operation of the memory controller 1700, and may perform logical operations. The processor 1731 may communicate with the host (HOST) through the host interface 1710, and may communicate with the memory device 1600 through the memory interface 1720.

The processor 1731 may perform the function of a flash translation layer (FTL). The processor 1731 may translate a logical block address (LBA) provided by the host into a physical block address (PBA) through the flash translation layer (FTL). The flash translation layer (FTL) may receive a logical block address (LBA), and may translate the same into a physical block address (PBA) by means of a mapping table.

There are several methods of mapping the addresses by the flash translation layer depending on the mapping unit. Typical address mapping methods include a page mapping method, a block mapping method, and a hybrid mapping method.

The processor 1731 is configured to randomize the data received from the host (HOST). For example, the processor 1731 will randomize data received from the host (HOST) using a randomizing seed. The randomized data is provided to the memory device 1600 as data to be stored, and is programmed in the memory cell array.

The processor 1731 is configured to derandomize data received from the memory device 1600 during a read operation. For example, the processor 1731 will derandomize the data received from the memory device 1600 using the derandomizing seed. The derandomized data will be output to the host (HOST).

The processor 1731 may execute firmware (FW) to control the operation of the memory controller 1700. In other words, the processor 1731 may execute (or drive) the firmware loaded in the working memory 1732 when booting in order to control the overall operation of the memory controller 1700 and perform logical operations.

The firmware is a program executed in the memory system 100, and may include various functional layers.

For example, the firmware may include at least one of a flash translation layer (FTL), a host interface layer (HIL) and a flash interface layer (FIL). The flash translation layer (FTL) performs conversion between a logical address requested by the host (HOST) to the memory system 100 and a physical address of the memory device 1600. The host interface layer (HIL) interprets a command, requested by the host (HOST) to the memory system 100, as a storage device and transmits the same to the flash translation layer (FTL). The flash interface layer (FIL) transmits a command indicated by the flash translation layer (FTL) to the memory device 1600.

The firmware, for example, may be stored in the memory device 1600, and may then be loaded in the working memory 1732.

The working memory 1732 may store firmware, program code, commands, or data necessary for driving the memory controller 1700. The working memory 1732 may include, for example, as a volatile memory, at least one of static RAM (SRAM), dynamic RAM (DRAM), and synchronous DRAM (SDRAM).

The error detection and correction circuit 1733 may be configured to detect an error bit of the data to be checked using the error correction code and to correct the detected error bit. The data to be checked may be, for example, data stored in the working memory 1732 or data read from the memory device 1600.

The error detection and correction circuit 1733 may be implemented to decode the data with the error correction code. The error detection and correction circuit 1733 may be implemented as any of various code decoders. For example, a decoder that performs unsystematic code decoding or a decoder that performs systematic code decoding may be used.

A bus 1740 may be configured to provide a channel between the components 1710, 1720, 1731, 1732, and 1733 of the memory controller 1700. The bus 1740 may include, for example, a control bus for transmitting various control signals and commands, and a data bus for transmitting a variety of data.

The above-described components 1710, 1720, 1731, 1732, 1733, and 1740 of the memory controller 1700 are only examples. Some of the aforementioned components 1710, 1720, 1731, 1732, 1733, and 1740 of the memory controller 1700 may be excluded, or may be integrated into one element. In some cases, one or more other components may be added in addition to the aforementioned components of the memory controller 1700.

The memory controller 1700 may be included in the host (HOST), or may be integrated with the memory device 1600.

The memory device 1600 may be the semiconductor device 100 including the monitoring circuit 200 according to an embodiment of the present disclosure. In addition, the memory controller 1700 for controlling the operation of the memory device 1600 may also be the semiconductor device 100 including the monitoring circuit 200 according to an embodiment of the present disclosure.

Figure 18:
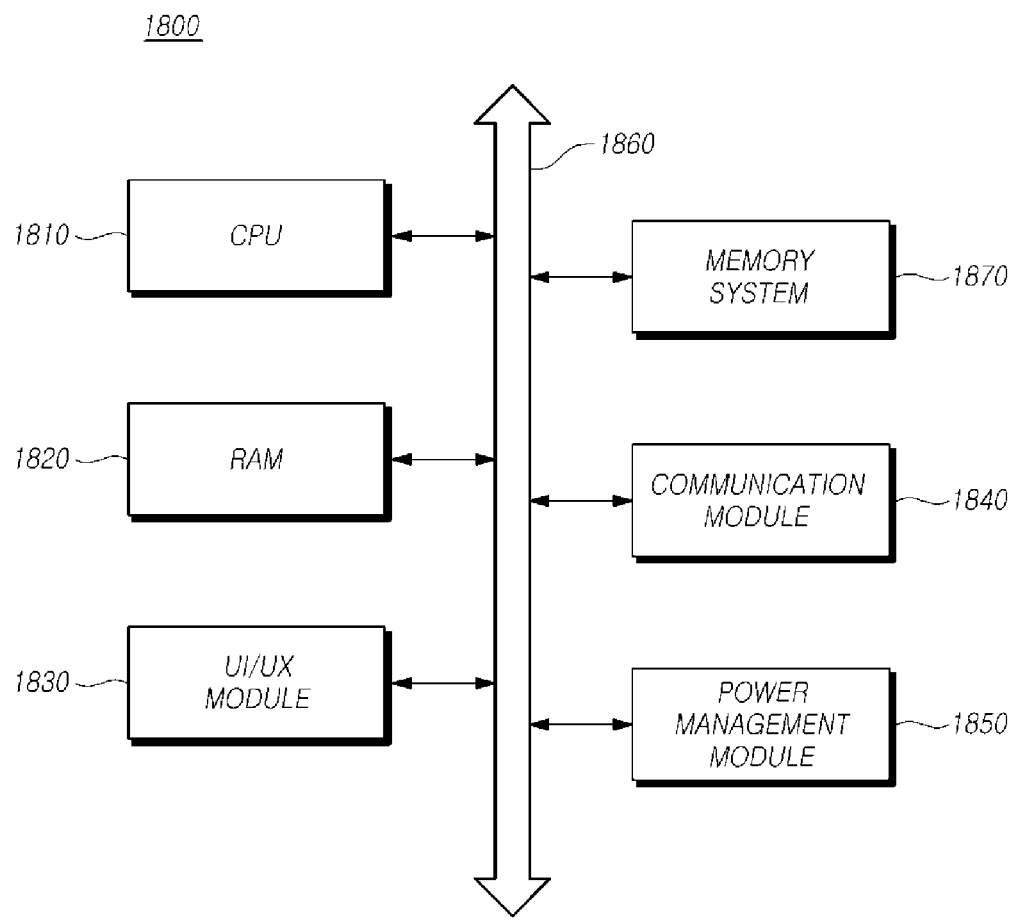
FIG. 18 is a diagram illustrating a computing system to which a semiconductor device according to an embodiment of the present disclosure is applied.

FIG. 18 is a diagram illustrating a computing system 1800 to which a semiconductor device according to various embodiments of the disclosure is applied.

Referring to FIG. 18, the computing system 1800 may include a central processing unit (CPU) 1810, a random access memory (RAM) 1820, a user interface/user experience (UI/UX) module 1830, a communication module 1840, and a power management module 1850, which are electrically connected to a system bus 1860. The central processing unit (CPU) 1810 may control the overall operation of the computing system 1800. The RAM 1820 may store data and information related to the operation of the computing system 1800. The user interface/user experience (UI/UX) module 1830 may provide a user with a user environment. The communication module 1840 may communicate with an external device through wired and/or wireless communication. The power management module 1850 may manage the power used by the computing system 1800.

The memory system 1870 may include the memory device 1600 implemented as a semiconductor device 100. In some cases, the memory system 1870 may further include the memory controller 1700.

The computing system 1800 may be a personal computer (PC), or may include a mobile terminal, such as a smart phone, and a tablet PC, or various electronic devices.

The computing system 1800 may further include a battery for supplying an operating voltage, an application chipset, a graphics-related module, a camera image processor (CIS), and a DRAM. In addition, the configuration of the computing system will be obvious to those skilled in the art.

In some embodiments, the memory system 1870 may include a device for storing data in a nonvolatile memory, such as a solid state drive (SSD), a universal flash storage (UFS) device, or an embedded MMC (eMMC) device, as well as a device for storing data in a magnetic disk, such as a hard disk drive (HDD). The nonvolatile memory may include read-only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM). In addition, the memory system 1870 may be implemented as any of various types of storage devices, and may be mounted to various electronic devices.

The central processing unit 1810, and the RAM 1820 may be implemented as a semiconductor device 100 including a monitoring circuit 200 according to an embodiment of the present disclosure. If one or more of the UI/UX module 1830, the communication module 1840, and the power management module 1850 are implemented as an integrated circuit (IC), the integrated circuit may be implemented as a semiconductor device 100 including a monitoring circuit 200 according to an embodiment of the present disclosure.

Hereinafter, the method for monitoring the state, characteristics, or performance of the semiconductor device 100 described above will be briefly described again.

Figure 19:
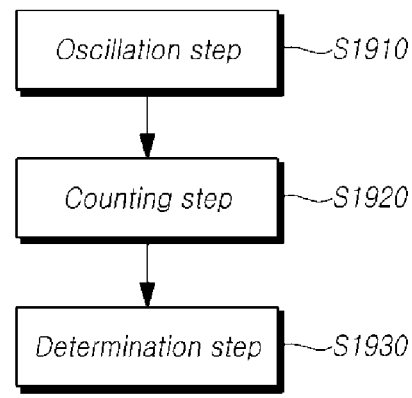
FIG. 19 is a flowchart illustrating a monitoring method according to an embodiment of the present disclosure.

FIG. 19 is a flowchart illustrating a monitoring method according to an embodiment of the present disclosure.

Referring to FIG. 19, the monitoring method may include steps (S1910), (S1920) and (S1930). The step (S1910) may include generating an oscillation signal (OSC) having a rising section and a falling section according to a threshold voltage level when an oscillation-enable signal is received. The step (S1920) may include counting the number of rises or the number of falls of the oscillation signal (OSC).

After step S1920, the monitoring method may include determination step (S1930). The monitoring method may include outputting semiconductor process state information (e.g., information indicating normal, abnormal, ULVT normal, ULVT abnormal, LVT normal, LVT abnormal, SVT normal, SVT abnormal) of the semiconductor device 100 on the basis of the difference between a count value (O_OSC_CNT) obtained by counting the number of rises or the number of falls of the oscillation signal (OSC) and a pre-stored reference value.

The monitoring method may be performed to check whether or not the semiconductor processing is normal immediately before shipping the semiconductor device 100 after the manufacturing process thereof is completed.

Alternatively, the monitoring method may be performed in a specific event situation or at periodic timing after the semiconductor device 100 is shipped and mounted to the computing system 1800.

According to an embodiment of the present disclosure, it is possible to accurately and quickly recognize the characteristics, performance, or state of the semiconductor device 100, thereby quickly and accurately identifying defects thereof.

In addition, according to an embodiment of the present disclosure, it is possible to provide a semiconductor device 100 capable of monitoring its own state, performance, or characteristics by itself.

In addition, according to an embodiment of the present disclosure, it is possible to provide a semiconductor device 100 capable of monitoring its own manufacturing process by itself.

In addition, according to an embodiment of the present disclosure, it is possible to accurately and quickly recognize whether or not each individual semiconductor device 100 is manufactured normally through semiconductor processing.

In addition, according to an embodiment of the present disclosure, it is possible to accurately monitor a semiconductor device 100 in which transistors having various threshold voltage levels are arranged.

In addition, according to an embodiment of the present disclosure, it is possible to provide a semiconductor device 100 capable of monitoring its own performance, characteristics, or state by itself when transistors arranged therein have various threshold voltage levels.

In addition, according to an embodiment of the present disclosure, it is possible to provide a monitoring circuit 200 capable of monitoring a semiconductor device 100 in a digital manner.

Although specific embodiments of the present disclosure have been described for illustrative purposes, those skilled in the art will appreciate that various other embodiments and modifications, additions and substitutions thereof are possible, without departing from the scope and spirit of the disclosure as disclosed in the accompanying claims.

What is claimed is:

1. A semiconductor device comprising:
   a first area;
   a second area; and
   a monitoring circuit comprising:
   an oscillation circuit configured to generate an oscillation signal having a rising characteristic or a falling characteristic according to a threshold voltage level; and
   a counter configured to count a number of rises or a number of falls of the oscillation signal,
   wherein the oscillation circuit and the counter is arranged on one of the first area and the second area.

2. The semiconductor device of claim 1,
   wherein the first area is an area in which core circuits are arranged; and wherein the second area is an area in which non-core circuits for supporting the operation of the core circuits are arranged.

3. The semiconductor device of claim 1, wherein the first area is an area in which a memory cell array is arranged; and
wherein the second area is an area in which a memory operation circuit for operating the memory cell array is arranged.

4. The semiconductor device of claim 1, wherein the first area is an area in which core circuits are arranged; and
wherein the second area is an area in which circuits for interface between the monitoring circuit and peripheral devices is arranged.

5. The semiconductor device of claim 1, wherein the first area and the second area is electrically connected.

6. The semiconductor device of claim 1, wherein the oscillation circuit and the counter is arranged on the second area.

7. The semiconductor device of claim 1, wherein the oscillation circuit is arranged on the first area and the counter is arranged on the second area.

8. The semiconductor device of claim 1, wherein the oscillation circuit is arranged on the second area and the counter is arranged on the first area.

9. The semiconductor device of claim 1, wherein the semiconductor device has a planar structure, and
wherein the first area and the second area exists in the same plane.

10. The semiconductor device of claim 1, further comprising:
a first substrate; and
a second substrate,
wherein the first area is arranged on a first circuit layer positioned on the first substrate, and wherein the second area is is arranged on a second circuit layer positioned on the second substrate.

11. A system comprising:
a monitoring circuit including an oscillation circuit configured to generate an oscillation signal having a rising characteristic or a falling characteristic according to a threshold voltage level and a counter configured to count a number of rises or a number of falls of the oscillation signal,
a monitoring controller to generate control signals in order to count the number of rises or the number of falls of the oscillation signal, and
a determiner configured to output semiconductor process state information based on a difference between a count value output from the counter and a pre-stored reference value.

12. The system of claim 11, wherein the control signals includes a count-enable signal for enabling a counting operation and a clock signal for controlling a counting operation time.

* * * * *